US012793940B2

(12) United States Patent
Koshimizu

(10) Patent No.: US 12,793,940 B2
(45) Date of Patent: Nov. 10, 2026

(54) PLASMA PROCESSING APPARATUS, CONTROL METHOD, POWER SUPPLY SYSTEM, AND STORAGE MEDIUM

(71) Applicant: Tokyo Electron Limited, Tokyo (JP)

(72) Inventor: Chishio Koshimizu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 345 days.

(21) Appl. No.: 18/665,826

(22) Filed: May 16, 2024

(65) Prior Publication Data

US 2024/0304418 A1 Sep. 12, 2024

Related U.S. Application Data

(63) Continuation of application No. PCT/JP2022/041958, filed on Nov. 10, 2022.

(30) Foreign Application Priority Data

Nov. 19, 2021 (JP) ................................ 2021-188307

(51) Int. Cl.
*H01J 37/32* (2006.01)

(52) U.S. Cl.
CPC ... *H01J 37/32174* (2013.01); *H01J 2237/327* (2013.01)

(58) Field of Classification Search
CPC ........... H01J 37/32174; H01J 2237/327; H01J 37/32146; H01J 37/32165; H01J 37/32715; H01J 37/32449; H01J 37/32091; H01J 37/32183; H01J 37/32642; H01J 37/32834; H05H 1/46; H10P 72/7624
See application file for complete search history.

(56) References Cited

U.S. PATENT DOCUMENTS

2014/0020831 A1* 1/2014 Ohgoshi ........... H01J 37/32146 156/345.24
2015/0096684 A1* 4/2015 Nagami ............ H01J 37/32174 156/345.28
2022/0336222 A1* 10/2022 Zhou ..................... H10P 50/283

FOREIGN PATENT DOCUMENTS

JP 2005-020414 A 1/2005
JP 2009-246091 A 10/2009
JP 2012-503431 A 2/2012
JP 2016-027667 A 2/2016

OTHER PUBLICATIONS

International Search Report issued on Jan. 17, 2023 for WO 2023/090252 A1, 11 pages including English Translation.

* cited by examiner

*Primary Examiner* — Renan Luque

(74) *Attorney, Agent, or Firm* — XSENSUS LLP

(57) ABSTRACT

In a plasma processing apparatus described herein, a bias power supply supplies an electric bias energy having a bias frequency to a substrate support unit at a timing specified by a first clock signal. A radio-frequency power supply outputs a source radio-frequency power having a source frequency adjusted at a timing specified by a second clock signal, when the electric bias energy is being supplied to the substrate support unit. The second clock signal has a frequency higher than the bias frequency, and is synchronized with the first clock signal.

15 Claims, 22 Drawing Sheets

PLASMA PROCESSING APPARATUS, CONTROL METHOD, POWER SUPPLY SYSTEM, AND STORAGE MEDIUM

CROSS-REFERENCE TO RELATED APPLICATIONS

This application is a Continuation of International Patent Application No. PCT/JP2022/041958, filed on Nov. 10, 2022, which claims priority from Japanese Patent Application No. 2021-188307, filed on Nov. 19, 2021, with the Japan Patent Office, all of each are incorporated herein in their entireties by reference.

TECHNICAL FIELD

The present disclosure relates to a plasma processing apparatus, a control method, a power supply system, and a storage medium.

BACKGROUND

Plasma processing apparatuses have been used in the plasma processing of substrates. In a plasma processing apparatus, a bias radio-frequency power is used to draw ions from plasma generated in a chamber to the substrates. Japanese Patent Laid-Open Publication No. 2009-246091 discloses a plasma processing apparatus that modulates a power level and a frequency of a bias radio-frequency power.

SUMMARY

According to an embodiment of the present disclosure, a plasma processing apparatus includes: a chamber; a substrate support provided in the chamber; a bias power supply that is electrically connected to the substrate support and generates an electric bias energy having a bias frequency at a timing specified by a first clock signal; and a radio-frequency power supply that generates a source radio-frequency power having a source frequency, in order to generate a plasma from a gas in the chamber. The radio-frequency power supply outputs the source radio-frequency power having the source frequency adjusted at a timing specified by a second clock signal, when the electric bias energy is being supplied to the substrate support, and the second clock signal has a frequency higher than the bias frequency, and is synchronized with the first clock signal.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
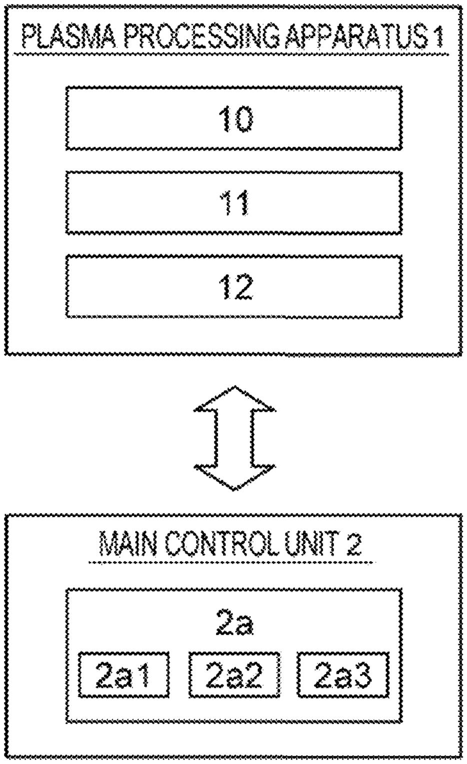
FIG. 1 is a view illustrating an example of a configuration of a plasma processing system.

In the following detailed description, reference is made to the accompanying drawings which form a part hereof. The illustrative embodiments described in the detailed description, drawings, and claims are not meant to be limiting. Other embodiments may be utilized, and other changes may be made without departing from the spirit or scope of the subject matter presented herein.

Hereinafter, various embodiments will be described in detail with reference to the drawings. In the drawings, the same or corresponding portions will be denoted by the same reference numerals.

FIG. 1 is a view illustrating an example of a configuration of a plasma processing system. In an embodiment, the plasma processing system includes a plasma processing apparatus 1 and a main control unit 2. The plasma processing system is an example of a substrate processing system, and the plasma processing apparatus 1 is an example of a substrate processing apparatus. The plasma processing apparatus 1 includes a plasma processing chamber 10, a substrate support unit 11, and a plasma generation unit 12. The plasma processing chamber 10 has a plasma processing space. Further, the plasma processing chamber 10 includes at least one gas supply port for supplying at least one processing gas to the plasma processing space, and at least one gas discharge port for discharging a gas from the plasma processing space. The gas supply port is connected to a gas supply unit 20 to be described later, and the gas discharge port is connected to an exhaust system 40 to be described later. The substrate support unit 11 is disposed in the plasma processing space, and includes a substrate support surface for supporting a substrate.

The plasma generation unit 12 is configured to generate plasma from at least one processing gas supplied into the plasma processing space. The plasma formed in the plasma processing space may be, for example, capacitively coupled plasma (CCP), inductively coupled plasma (ICP), electron-cyclotron-resonance (ECR) plasma, helicon wave excited plasma (HWP), or helicon wave excited plasma (HWP).

The main control unit 2 processes computer-executable instructions for causing the plasma processing apparatus 1 to perform various processes described herein below. The main control unit 2 may be configured to control each component of the plasma processing apparatus 1 to perform the various processes described herein below. In an embodiment, a portion of the main control unit 2 or the entire main control unit 2 may be included in the plasma processing apparatus 1. The main control unit 2 may include a processing unit **2*a*1, a storage unit 2*a*2, and a communication interface 2*a*3. The main control unit 2 is implemented by, for example, a computer 2*a*. The processing unit 2*a*1 may be configured to perform various control operations by reading a program from the storage unit 2*a*2 and executing the read program. The program includes computer-executable instructions that cause the plasma processing apparatus 1 to perform various processes of a control method according to an embodiment to be described later. The program may be stored in the storage unit 2*a*2 in advance, or may be acquired from a medium as needed. The program may be transmitted to the main control unit 2 from a host management stem. The acquired program is stored in the storage unit 2*a*2, and read from the storage unit 2*a*2 by the processing unit 2*a*1 to be executed. The medium may be any of various storage media readable by the computer 2*a*, or a communication line connected to the communication interface 2*a*3. The processing unit 2*a*1 may be a central processing unit (CPU). The memory unit 2*a*2 may include a random access memory (RAM), a read only memory (ROM), a hard disk drive (HDD), a solid state drive (SSD), or a combination thereof. The communication interface 2*a*3 may communicate with the plasma processing apparatus 1** via a communication line such as a local area network (LAN).

Figure 2:
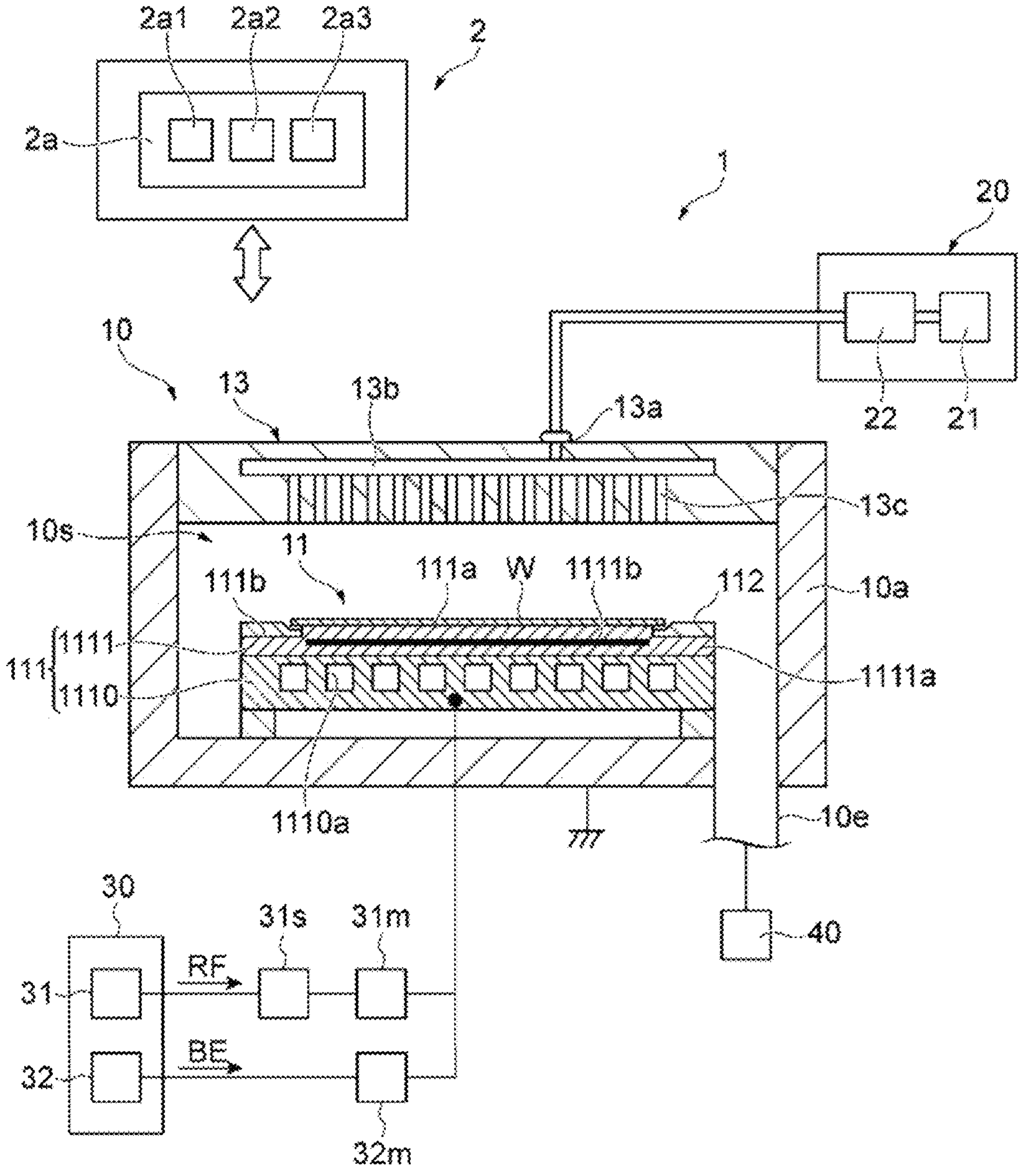
FIG. 2 is a view illustrating an example of a configuration of a capacitively coupled plasma processing apparatus.

Hereinafter, descriptions will be made on an example of a configuration of a capacitively coupled plasma processing apparatus, which is an example of the plasma processing apparatus 1. FIG. 2 is a view for explaining the example of the configuration of the capacitively coupled plasma processing apparatus.

The capacitively coupled plasma processing apparatus 1 includes a plasma processing chamber 10, a gas supply unit 20, a power supply system 30, and an exhaust system 40. Further, the plasma processing apparatus 1 includes a substrate support unit 11 and a gas introduction unit. The gas introduction unit is configured to introduce at least one processing gas into the plasma processing chamber 10. The gas introduction unit includes a shower head 13. The substrate support unit 11 is disposed in the plasma processing chamber 10. The shower head 13 is disposed above the substrate support unit 11. In an embodiment, the shower head 13 makes up at least a portion of the ceiling of the plasma processing chamber 10. The plasma processing chamber 10 has a plasma processing space **10*s* defined by the shower head 13, the side wall 10*a* of the plasma processing chamber 10, and the substrate support unit 11. The plasma processing chamber 10 is grounded. The substrate support unit 11 is electrically insulated from the housing of the plasma processing chamber 10**.

The substrate support unit 11 includes a main body 111 and a ring assembly 112. The main body 111 has a central region **111*a* for supporting a substrate W, and an annular region 111*b* for supporting the ring assembly 112. A wafer is an example of the substrate W. The annular region 111*b* of the main body 111 surrounds the central region 111*a* of the main body 111 in a plan view. The substrate W is placed on the central region 111*a* of the main body 111, and the ring assembly 112 is disposed on the annular region 111*b* of the main body 111 to surround the substrate W placed on the central region 111*a* of the main body 111. Thus, the central region 111*a* is also referred to as a substrate support surface for supporting the substrate W, and the annular region 111*b* is also referred to as a ring support surface for supporting the ring assembly 112**.

In an embodiment, the main body 111 includes a base 1110 and an electrostatic chuck 1111. The base 1110 includes a conductive member. The electrostatic chuck 1111 is disposed on the base 1110. The electrostatic chuck 1111 includes a ceramic member **1111*a* and an electrostatic electrode 1111*b* disposed inside the ceramic member 1111*a*. The ceramic member 1111*a* has the central region 111*a*. In an embodiment, the ceramic member 1111*a* also has the annular region 111*b*. Further, another member surrounding the electrostatic chuck 1111, such as an annular electrostatic chuck or an annular insulating member, may have the annular region 111*b*. In this case, the ring assembly 112 may be disposed on the annular electrostatic chuck or the annular insulating member, or may be disposed on both the electrostatic chuck 1111** and the annular insulating member.

The ring assembly 112 includes one or a plurality of annular members. In an embodiment, one or the plurality of annular members include one or a plurality of edge rings and at least one covering ring. The edge rings are formed of a conductive or insulating material, and the covering ring is formed of an insulating material.

Further, the substrate support unit 11 may include a temperature control module configured to regulate at least one of the electrostatic chuck 1111, the ring assembly 112, and the substrate to a target temperature. The temperature control module may include a heater, a heat transfer medium, a flow path **1110*a*, or a combination thereof. A heat transfer fluid, such as brine or gas, flows in the flow path 1110*a*. In an embodiment, the flow path 1110*a* is formed in the base 1110, and one or a plurality of heaters is disposed in the ceramic member 1111*a* of the electrostatic chuck 1111. Further, the substrate support unit 11 may include a heat transfer gas supply unit configured to supply the heat transfer gas to the gap between the back surface of the substrate W and the central region 111*a***.

The shower head 13 is configured to introduce at least one processing gas from the gas supply unit 20 into the plasma processing space **10*s*. The shower head 13 includes at least one gas supply port 13*a*, at least one gas diffusion chamber 13*b*, and a plurality of gas introduction ports 13*c*. The processing gas supplied to the gas supply port 13*a* passes through the gas diffusion chamber 13*b*, and is introduced into the plasma processing space 10*s* from the plurality of gas introduction ports 13*c*. Further, the shower head 13 includes at least one upper electrode. Further, the gas introduction unit may include one or a plurality of side gas injectors (SGI) attached to one or a plurality of openings formed in the side wall 10*a***.

The gas supply unit 20 may include at least one gas source 21 and at least one flow controller 22. In an embodiment, the gas supply unit 20 is configured to supply at least one processing gas from its corresponding gas source 21 to the shower head 13 via its corresponding flow controller 22. Each flow controller 22 may include, for example, a mass flow controller or a pressure-controlled flow controller. Further, the gas supply unit 20 may include at least one flow modulation device that modulates or pulses the flow rate of the at least one processing gas.

The exhaust system 40 may be connected to, for example, a gas discharge port 10*e* formed at the bottom of the plasma processing chamber 10. The exhaust system 40 may include a pressure regulating valve and a vacuum pump. The pressure in the plasma processing space 10*s* is adjusted by the pressure regulating valve. The vacuum pump may include a turbo molecular pump, a dry pump, or a combination thereof.

The power supply system 30 includes a radio-frequency power supply 31 and a bias power supply 32. The radio-frequency power supply 31 makes up the plasma generation unit 12 of an embodiment. The radio-frequency power supply 31 is configured to generate a source radio-frequency power RF. The source radio-frequency power RF has a source frequency $f_{RF}$. That is, the source radio-frequency power RF has a sinusoidal waveform of which frequency is the source frequency $f_{RF}$. The source frequency $f_{RF}$ may be a frequency in the range of 10 MHz to 150 MHz. The radio-frequency power supply 31 is electrically connected to a radio-frequency electrode via a matching unit 31*m*, and configured to supply the source radio-frequency power RF to the radio-frequency electrode. The radio-frequency electrode may be the conductive member of the base 1110, at least one electrode provided in the ceramic member 1111*a*, or an upper electrode. When the source radio-frequency power RF is supplied to the radio-frequency electrode, plasma is generated from a gas in the chamber 10. The matching unit 31*m* has a variable impedance. The variable impedance of the matching unit 31*m* is controlled by the main control unit 2 to reduce the reflection of the source radio-frequency power RF from a load.

The bias power supply 32 is configured to generate an electric bias energy BE. The bias power supply 32 is electrically connected to the substrate support unit 11. The bias power supply 32 is electrically connected to a bias electrode in the substrate support unit 11, and configured to supply the electric bias energy BE to the bias electrode. The bias electrode may be the conductive member of the base 1110 or at least one electrode provided in the ceramic member 1111*a*. When the electric bias energy BE is supplied to the bias electrode, ions from the plasma are drawn to the substrate W.

The electric bias energy BE has a bias frequency. The bias frequency is lower than the source frequency. The bias frequency may be in the range of 100 kHz to 60 MHz, and may be, for example, 400 kHz. The electric bias energy BE is supplied to the bias electrode periodically at a bias cycle (time interval) having a time length corresponding to the reciprocal of the bias frequency, i.e., a cycle CY.

Figure 5:
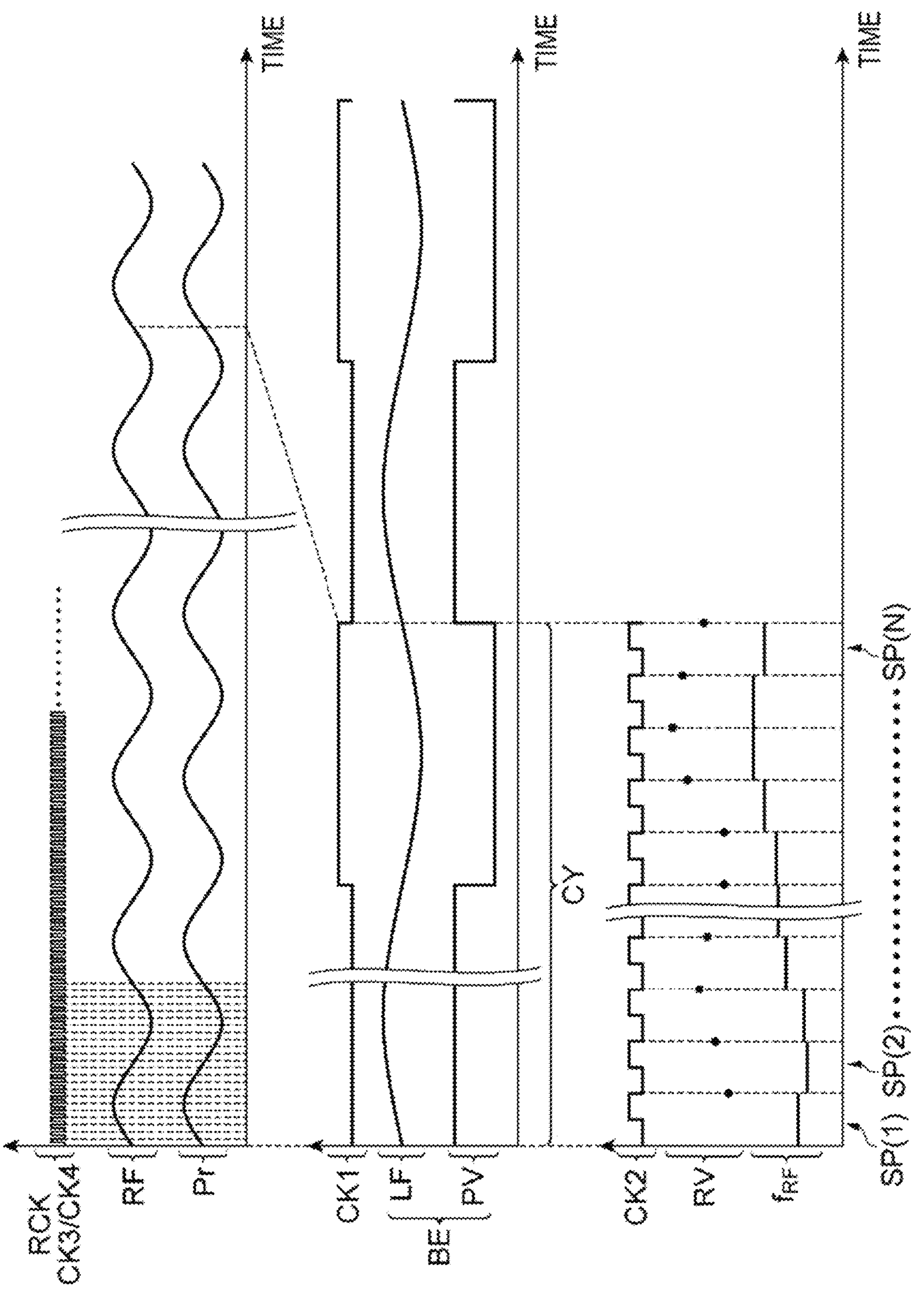
FIG. 5 is a timing chart related to a plasma processing apparatus according to an embodiment.

The electric bias energy BE may be a bias radio-frequency power LF having a bias frequency (see, e.g., FIG. 5). That is, the electric bias energy BE may have a sinusoidal waveform of which frequency is a bias frequency. In this case, the bias power supply 32 is electrically connected to the bias electrode via the matching unit 32*m*. The variable impedance circuit (i.e., the matching circuit) of the matching unit 32*m* is controlled by the main control unit 2 to reduce the reflection of the bias radio-frequency power LF from a load.

Alternatively, the electric bias energy BE may include a pulse PV of a voltage. The waveform of the pulse PV in the electric bias energy BE may have a square wave, a triangular wave, or any waveform. The polarity of the voltage of the pulse PV in the electric bias energy BE is set to cause a potential difference between the substrate W and the plasma, thereby drawing ions from the plasma to the substrate W. In an example, the pulse PV of the electric bias energy BE may be a pulse of a negative voltage. The pulse PV of the electric bias energy BE may be generated by the waveform shaping using a pulse unit for a DC voltage from a DC power supply.

Figure 3:
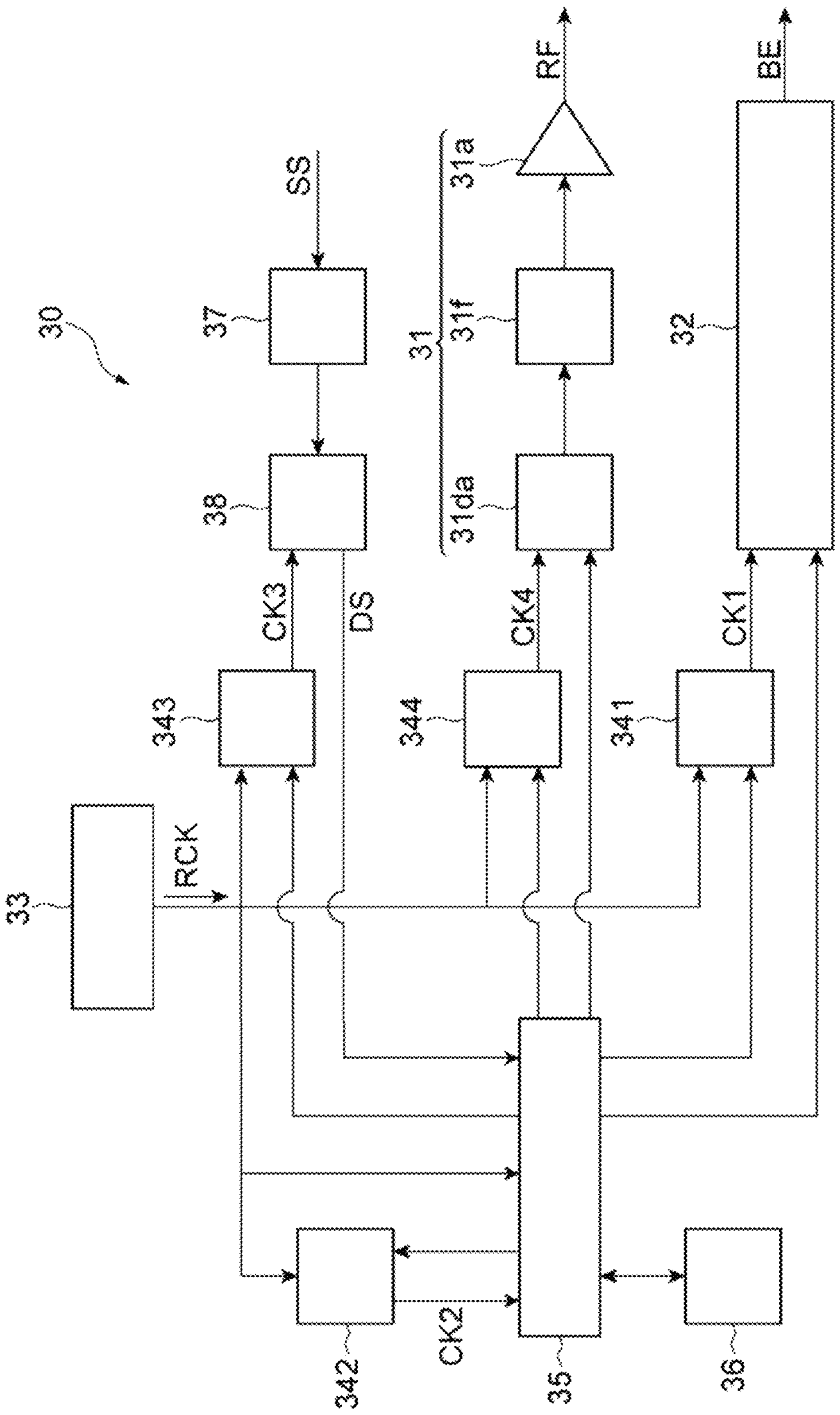
FIG. 3 is a view illustrating a power supply system according to an embodiment.
Figure 4A:
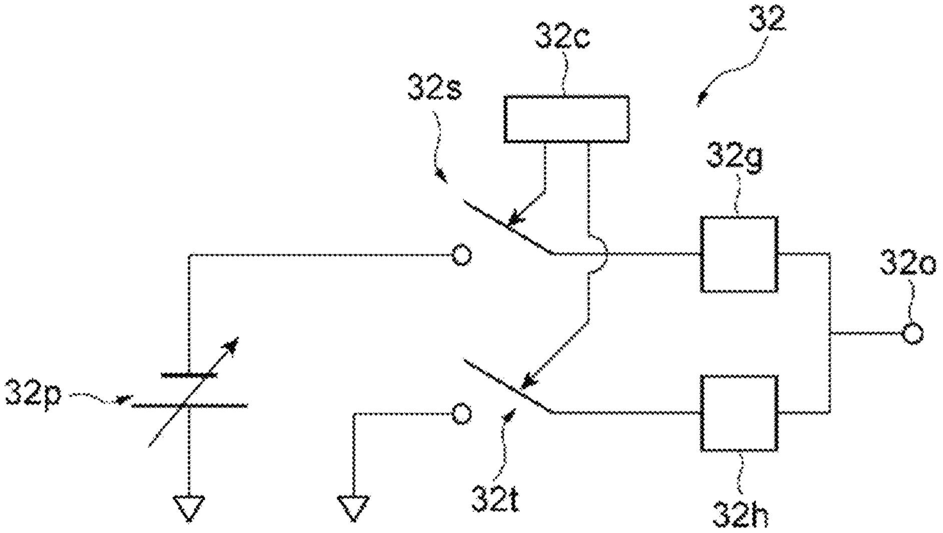
FIGS. 4A and 4B are each a view illustrating a bias power supply according to an embodiment.
Figure 4B:
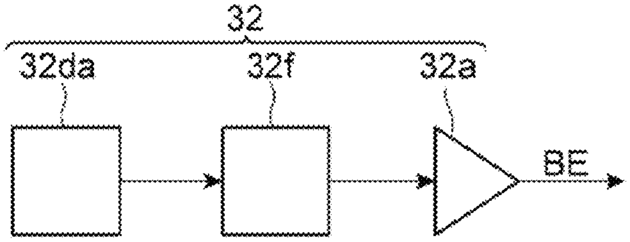

Hereinafter, the power supply system 30 will be described in detail with reference to FIGS. 3 to 5. FIG. 3 is a view illustrating a power supply system according to an embodiment. FIGS. 4A and 4B are each a view illustrating a bias power supply according to an embodiment. FIG. 5 is a timing chart related to a plasma processing apparatus according to an embodiment. In FIG. 5, "RF" indicates a power level of a traveling wave of the source radio-frequency power RF.

The bias power supply 32 is configured to generate the electric bias energy BE at a timing specified by a first clock signal CK1. The power supply system 30 may further include a reference clock signal generator 33. The reference clock signal generator 33 is configured to generate a reference clock signal RCK. The frequency of the reference clock signal RCK is, for example, 1 GHz. The first clock signal CK1 may be generated by dividing the frequency of the reference clock signal RCK using a frequency divider 341. The frequency division ratio of the frequency divider 341 and the duty ratio of the clock pulse in the first clock signal CK1 are specified in the frequency divider 341 from the control unit 35.

In an embodiment, the frequency of the first clock signal CK1 may be the same as the bias frequency. In this case, the first clock signal CK1 includes a clock pulse that is generated periodically at the same time interval as the cycle CY. When the electric bias energy BE is the bias radio-frequency power LF, the bias power supply 32 generates the bias radio-frequency power LF such that the cycle CY starts in synchronization with the first clock signal CK1. For example, the bias power supply 32 generates the bias radio-frequency power LF such that the cycle CY starts at a timing of one of the vertical rise and the vertical fall of the first clock signal CK1. In the descriptions herein, the vertical rise and the vertical fall of the clock signal indicate the vertical rise and the vertical fall of the clock pulse in the clock signal.

When the electric bias energy BE includes the pulse PV, the bias power supply 32 starts generating the pulse PV at the timing of one of the vertical rise and the vertical fall of the first clock signal CK1. The bias power supply 32 stops the generation of the pulse PV at the timing of the other of the vertical rise and the vertical fall of the first clock signal CK1. In this case, the frequency divider 341 sets the duty ratio of the clock pulse of the first clock signal CK1 based on the duty ratio of the pulse PV according to an instruction from the control unit 35.

When the electric bias energy BE includes the pulse PV, the bias power supply 32 may have the configuration illustrated in FIG. 4A. In the example illustrated in FIG. 4A, the bias power supply 32 includes a DC power supply 32*p*, switches 32*s* and 32*t*, damping circuits 32*g* and 32*h*, an output 32*o*, and a switching control unit 32*c*. The switches 32*s* and 32*t* and the switching control unit 32*c* make up the pulse unit. The positive pole of the DC power supply 32*p* is connected to the ground. The negative pole of the DC power supply 32*p* is connected to the switch 32*s*. The switch 32*s* is connected to the output 32*o* via the damping circuit 32*g*. The switch 32*t* is connected between the ground and the damping circuit 32*h*. The damping circuit 32*h* is connected to the output 32*o*. The output 32*o* is connected to the bias electrode. The damping circuits 32*g* and 32*h* are circuits that reduce the ringing during switching. The damping circuits 32*g* and 32*h* may be inserted into the bias power supply 32 as necessary. Each of the damping circuits 32*g* and 32*h* may be provided at a connection position other than the connection position illustrated in FIG. 4A.

The switching control unit 32*c* controls the switches 32*s* and 32*t* to close the switch 32*s* and open the switch 32*t*, at the timing of one of the vertical rise and the vertical fall of the first clock signal CK1. Thus, the DC power supply 32*p* is connected to the output 32*o* at the timing of one of the vertical rise and the vertical fall of the first clock signal CK1. The switching control unit 32*c* controls the switches 32*s* and 32*t* to open the switch 32*s* and close the switch 32*t*, at the timing of the other of the vertical rise and the vertical fall of the first clock signal CK1. Thus, the output 32*o* is connected to the ground at the timing of the other of the vertical rise and the vertical fall of the first clock signal CK1. Alternatively, the switching control unit 32*c* may control the switches 32*s* and 32*t* to open the switch 32*s* and close the switch 32*t*, at a timing when a specified time elapses from the time when the output 32*o* is connected to the DC power supply 32*p*.

In another embodiment, the frequency of the first clock signal CK1 may be higher than the bias frequency. The power supply system 30 may not include the frequency divider 341, and the first clock signal CK1 may be the reference clock signal RCK. Alternatively, the first clock signal CK1 may be generated by dividing the frequency of the reference clock signal RCK using the frequency divider 341. In the present embodiment, the electric bias energy BE may be the bias radio-frequency power LF or a voltage (e.g., the pulse PV) generated periodically at a time interval, which is the reciprocal of the bias frequency. In the present embodiment, the bias power supply 32 may include a D/A converter 32*da* (digital-to-analog converter), a filter 32*f*, and an amplifier 32*a*, as illustrated in FIG. 4B.

The D/A converter 32*da* receives waveform data of the electric bias energy BE, which is stored in the memory 36, from the control unit 35. The D/A converter 32*da* performs a digital-to-analog conversion (D/A conversion) of the waveform data at a timing specified by the first clock signal CK1 to generate an analog signal, and outputs the generated analog signal from the output thereof. The output of the D/A converter 32*da* is connected to the input of the amplifier 32*a* via the filter 32*f*. The filter 32*f* removes unnecessary radio-frequency components from the input analog signal. The amplifier 32*a* amplifies the analog signal from the filter 32*f* to generate the electric bias energy BE. Further, the output of the D/A converter 32*da* may be connected directly to the input of the amplifier 32*a*.

The radio-frequency power supply 31 is configured to output the source radio-frequency power RF having the source frequency $f_{RF}$. The source frequency $f_{RF}$ is adjusted at a timing specified by a second clock signal CK2 when the electric bias energy BE is being supplied to the bias electrode. Each cycle CY of the electric bias energy BE is divided into a plurality of phase periods SP each having a start timing synchronized with one of the vertical rise and the vertical fall of the second clock signal CK2. The plurality of phase periods SP have the same time length. The source frequency $f_{RF}$ is set and maintained at the start timing of each of the plurality of phase periods SP within each cycle CY. The details of the adjustment of the source frequency $f_{RF}$ will be described later.

The second clock signal CK2 has a frequency higher than the bias frequency, and is synchronized with the first clock signal CK1. The frequency of the second clock signal CK2 may be lower than the source frequency $f_{RF}$. The frequency of the second clock signal CK2 is N times the bias frequency. Here, N indicates the number of the plurality of phase periods SP in each cycle CY, and is, for example, 50. The second clock signal CK2 is generated by dividing the frequency of the reference clock signal RCK by a frequency divider 342. The frequency division ratio of the frequency divider 342 is specified in the frequency divider 342 from the control unit 35.

In an embodiment, the radio-frequency power supply 31 may include a D/A converter 31*da* (digital-to-analog converter), a filter 31*f*, and an amplifier 31*a*. The D/A converter 31*da* receives waveform data of the source radio-frequency power RF, which is stored in the memory 36, from control unit 35. The D/A converter 31*da* performs a digital-to-analog conversion (D/A conversion) of the waveform data at a timing specified by a fourth clock signal CK4 to generate an analog signal, and outputs the generated analog signal from the output thereof. The output of the D/A converter 31*da* is connected to the input of the amplifier 31*a* via the filter 31*f*. The filter 31*f* removes unnecessary radio-frequency components from the input analog signal. The amplifier 31*a* amplifies the analog signal from the filter 31*f* to generate the source radio-frequency power RF. The output of the D/A converter 31*da* may be connected directly to the input of the amplifier 31*a*.

The frequency of the fourth clock signal CK4 is higher than the frequency of the second clock signal CK2. The fourth clock signal CK4 may be the reference clock signal RCK. Alternatively, the fourth clock signal CK4 may be generated by dividing the frequency of the reference clock signal RCK using a frequency divider 344. The frequency division ratio of the frequency divider 344 is specified by the control unit 35.

As illustrated in FIG. 2, the plasma processing apparatus 1 further includes a sensor 31*s*. The sensor 31*s* is configured to output an electric signal SS (see, e.g., FIG. 3) reflecting the degree of reflection of the source radio-frequency power RF from a load. The sensor 31*s* is provided, for example, between the radio-frequency power supply 31 and the matching unit 31*m*. The sensor 31*s* may be a directional coupler, and the electric signal SS may be a signal representing a power level Pr of a reflected wave of the source radio-frequency power RF from a load. The sensor 31*s* may be configured to detect a voltage and a current in a power feed path connecting the radio-frequency power supply 31 and the radio-frequency electrode to each other, and the electrical signal SS may be a signal representing the voltage and the current.

The power supply system 30 further includes an A/D converter 38 (analog-to-digital converter). The output of the sensor 31*s* is connected to the input of the A/D converter 38. The output of the sensor 31*s* may be connected to the input of the A/D converter 38 via a filter 37. The filter 37 is configured to remove a harmonic wave component, an intermodulation distortion component, and a bias component other than the component of the source frequency $f_{RF}$ in the electric signal SS to generate a filtered signal, and output the filtered signal. The A/D converter 38 is configured to perform an analog-to-digital conversion (A/D conversion) on the electric signal SS or the filtered signal to generate a digital signal DS at a timing specified by a third clock signal CK3. The third clock signal CK3 may be the reference clock signal RCK. Alternatively, the third clock signal CK3 may be generated by dividing the frequency of the reference clock signal RCK using a frequency divider 343. The frequency division ratio of the frequency divider 343 is specified by the control unit 35.

The control unit 35 is configured to generate a representative value RV from the digital signal DS in each of the plurality of phase periods SP. Thus, the control unit 35 determines a measurement value from the digital signal DS. The measurement value may be the power level Pr of the reflected wave. The measurement value may be a value of the ratio of the power level Pr of the reflected wave to the output power level of the source radio-frequency power RF. The measurement value may be each value, an average value, or an effective value of the voltage and the current in each of the plurality of phase periods SP, or a phase difference between the voltage and the current. The representative value RV may be an average or maximum value of the measurement value in each of the plurality of phase periods SP. The control unit 35 determines the source frequency $f_{RF}$ that may suppress the reflection of the source radio-frequency power RF based on the representative value RV, efficiently transfer the source radio-frequency power RF to the plasma, or make the impedance at the sensor location close to an ideal value (e.g., 50Ω). The control unit 35 uses the determined source frequency $f_{RF}$ as the source frequency $f_{RF}$ of the source radio-frequency power RF in the same phase period within the subsequent cycle CY. The control unit 35 gives waveform data having the determined source frequency $f_{RF}$ to the D/A converter **31*da* of the radio-frequency power supply 31**.

In the plasma processing apparatus 1 described above, the source frequency $f_{RF}$ of the source radio-frequency power RF is adjusted in the plurality of phases within the cycle CY of the electric bias energy BE. The timing for adjusting the source frequency $f_{RF}$ is specified by the second clock signal CK2. The second clock signal CK2 is synchronized with the first clock signal CK1 that specifies the timing for generating the electric bias energy BE. Thus, the phases within the cycle CY of the electric bias energy BE and the timing for adjusting the source frequency $f_{RF}$ may be precisely synchronized.

Figure 6:
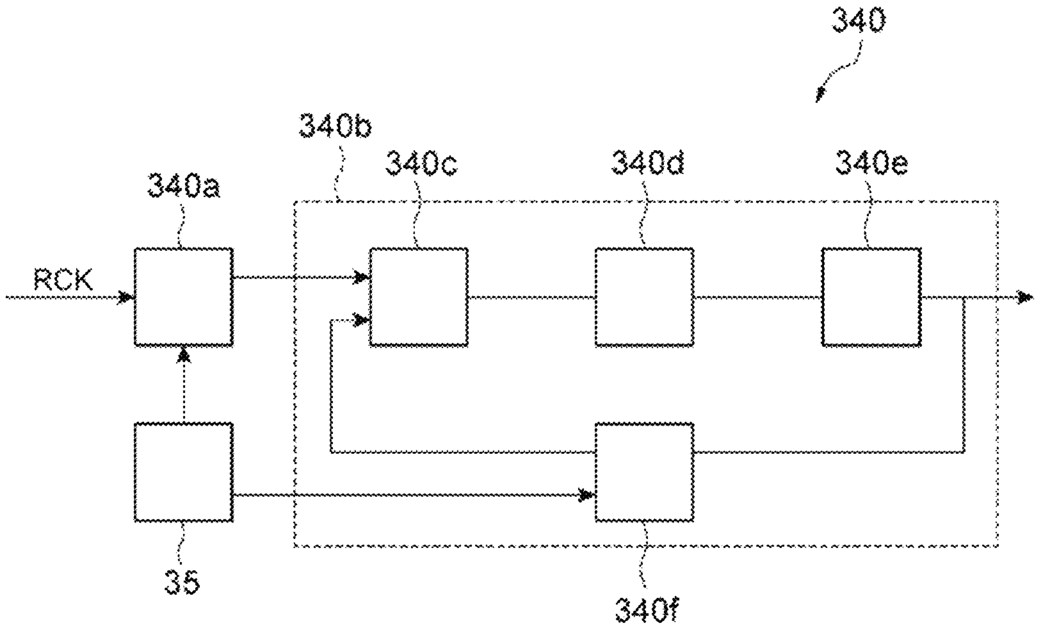
FIG. 6 is a view illustrating an example of a frequency divider, which may be employed in the plasma processing apparatus according to an embodiment.

In an embodiment, at least one of the frequency dividers 341, 342, 343, and 344 described above may be a frequency divider 340 illustrated in FIG. 6. FIG. 6 is a view illustrating an example of a frequency divider, which may be employed in a plasma processing apparatus according to an embodiment. The frequency divider 340 includes a frequency demultiplier **340*a* and a PLL circuit 340*b* (phase locked loop circuit). The PLL circuit 340*b* includes a phase comparator 340*c*, a low pass filter 340*d*, a voltage controlled oscillator 340*e*, and a frequency demultiplier 340*f*. The input of the frequency demultiplier 340*a* is connected to the output of the reference clock signal generator 33. The output of the frequency demultiplier 340*a* is connected to the reference input of the phase comparator 340*c*. The output of the phase comparator 340*c* is connected to the input of the low pass filter 340*d*. The output of the low pass filter 340*d* is connected to the input of the voltage controlled oscillator 340*e*. The output of the voltage-controlled oscillator 340*e*, i.e., the output of the frequency divider 340, outputs a clock signal generated by dividing the frequency of the reference clock signal RCK. The output of the voltage-controlled oscillator 340*e* is connected to the feedback input of the phase comparator 340*c* via the frequency demultiplier 340*f*. The division ratio X of the frequency demultiplier 340*a* and the division ratio Y of the frequency demultiplier 340*f* are specified by the control unit 35. Here, Y<X, and the division ratio of the frequency divider 340 is Y/X. Further, in order to adjust the duty ratio of the clock pulse output from the frequency divider 340, the duty ratio of the clock pulse may be specified in the frequency demultiplier 340*a* and the voltage controlled oscillator 340*e* by the control unit 35**.

Figure 7:
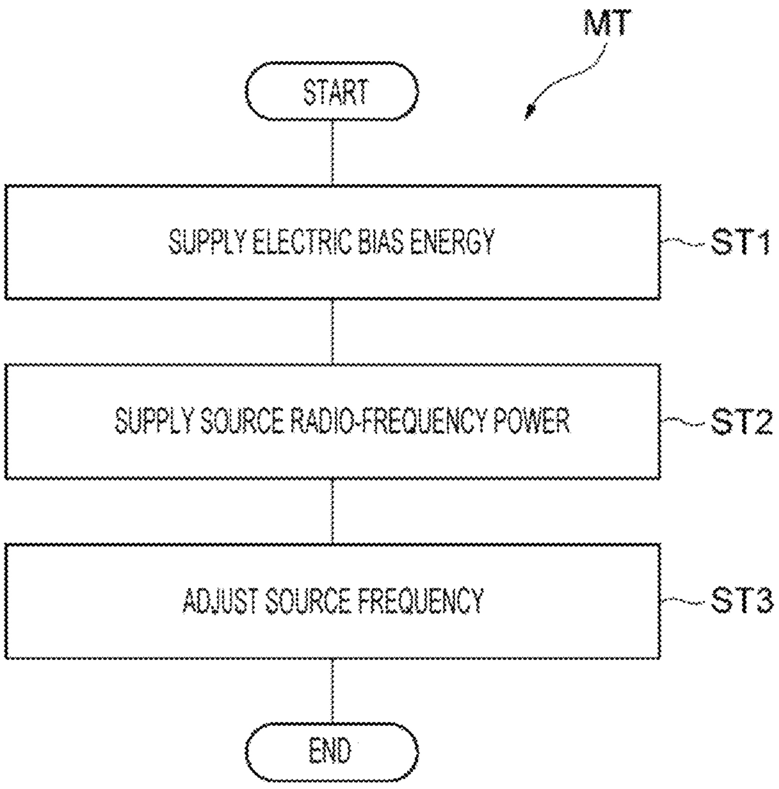
FIG. 7 is a flowchart of a control method according to an embodiment.

Hereinafter, the control method according to an embodiment will be described with reference to FIG. 7. A control method MT includes steps ST1 to ST3. In step ST1, the electric bias energy BE is supplied to the substrate support unit 11 from the bias power supply 32. In step ST1, the electric bias energy BE is generated at the timing specified by the first clock signal CK1 as described above.

In step ST2, the source radio-frequency power RF is supplied from the radio-frequency power supply 31 to generate plasma from a gas in the chamber 10. When the electric bias energy BE is being supplied to the substrate support unit 11 or simultaneously with the supply, the radio-frequency power supply 31 outputs the source radio-frequency power RF having the source frequency $f_{RF}$ adjusted at the timing specified by the second clock signal CK2 as described above, in step ST2. The second clock signal CK2 has a frequency lower than the source frequency and higher than the bias frequency, and is synchronized with the first clock signal CK1. As described above, the source frequency $f_{RF}$ is set to suppress the reflection of the source radio-frequency power RF according to the representative value RV of the electric signal SS acquired in each of the plurality of phase periods SP. The source frequency set in each of the plurality of phase periods SP is used as the source frequency of the source radio-frequency power RF in the same phase period of the subsequent cycle CY.

Below are several examples of the adjustment of the source frequency $f_{RF}$ in each of the plurality of phase periods SP.

First Example of Adjustment of Source Frequency $f_{RF}$

Figure 8:
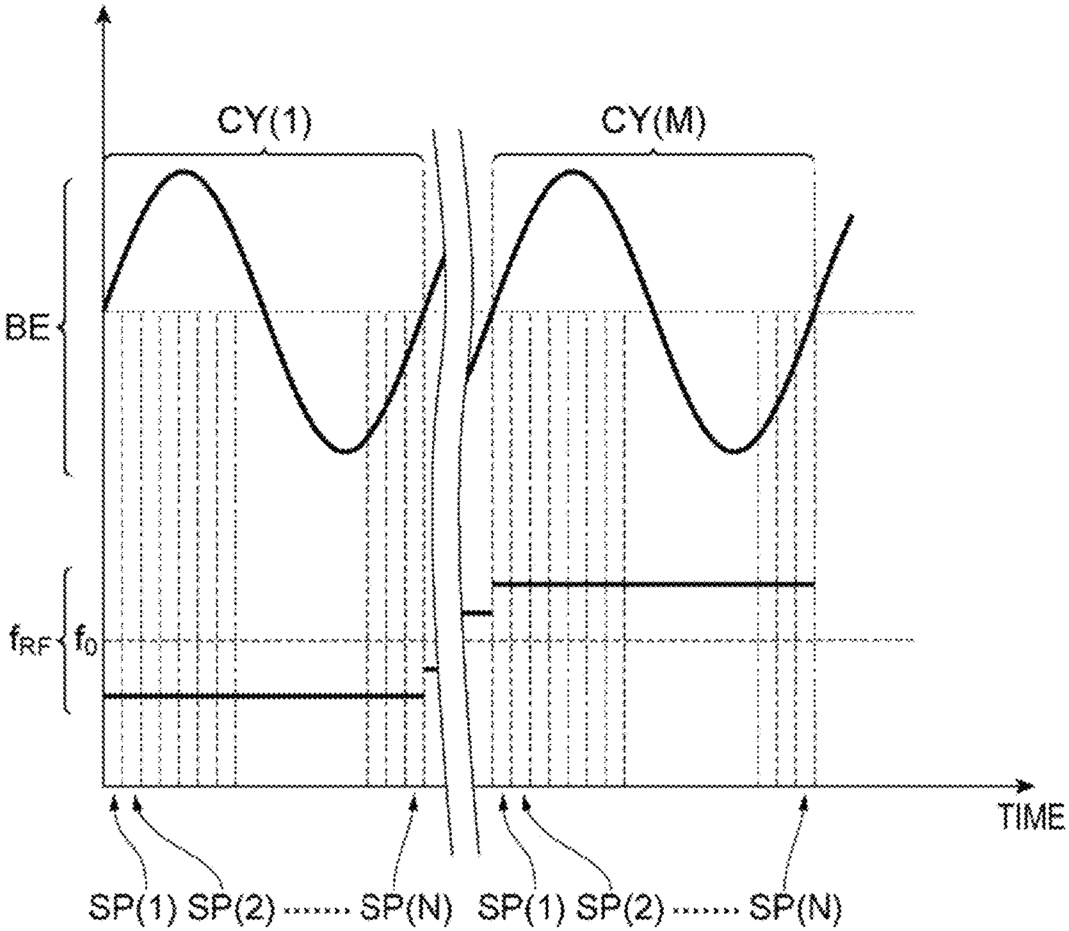
FIG. 8 is a timing chart related to a first example of a source frequency adjustment.

FIG. 8 is a timing chart related to a first example of the adjustment of the source frequency. In the several examples described below as well, the source frequency $f_{RF}$ is adjusted during the period when both the electric bias energy BE and the source radio-frequency power RF are being supplied, i.e., an overlap period. The overlap period includes a plurality of cycles CY, i.e., an M number of cycles CY(1) to CY(M) as illustrated in FIG. 8. Each of the plurality of cycles CY includes a plurality of phase periods SP, i.e., an N number of phase periods SP(1) to SP(N). In the descriptions hereinafter, a phase period SP(n) represents an n-th phase period among the phase periods SP(1) to SP(N). Further, a phase period SP(m,n) represents the n-th phase period SP(n) in an m-th cycle CY(m). A representative value RV(n) represents the representative value RV acquired in the n-th phase period SP(n) among the phase periods SP(1) to SP(N). Further, a representative value RV(m,n) represents the representative value RV acquired in the n-th phase period within the m-th cycle CY.

In the first example, the control unit 35 sets the source frequencies $f_{RF}$ of the source radio-frequency powers RF used in the same phase periods SP(n) of the plurality of cycles CY, to a plurality of different frequencies, respectively. The control unit 35 compares the representative values RV(n) acquired in the same phase periods SP(n) of the plurality of cycles CY, to select a frequency that most suppresses the reflection of the source radio-frequency power RF among the plurality of frequencies. For example, the control unit 35 selects a frequency that minimizes the power level Pr of the reflected wave of the source radio-frequency power RF. The control unit 35 uses the selected frequency as the source frequency $f_{RF}$ for the phase period SP(n) in the subsequent cycle CY.

Second Example of Adjustment of Source Frequency $f_{RF}$

Figure 9:
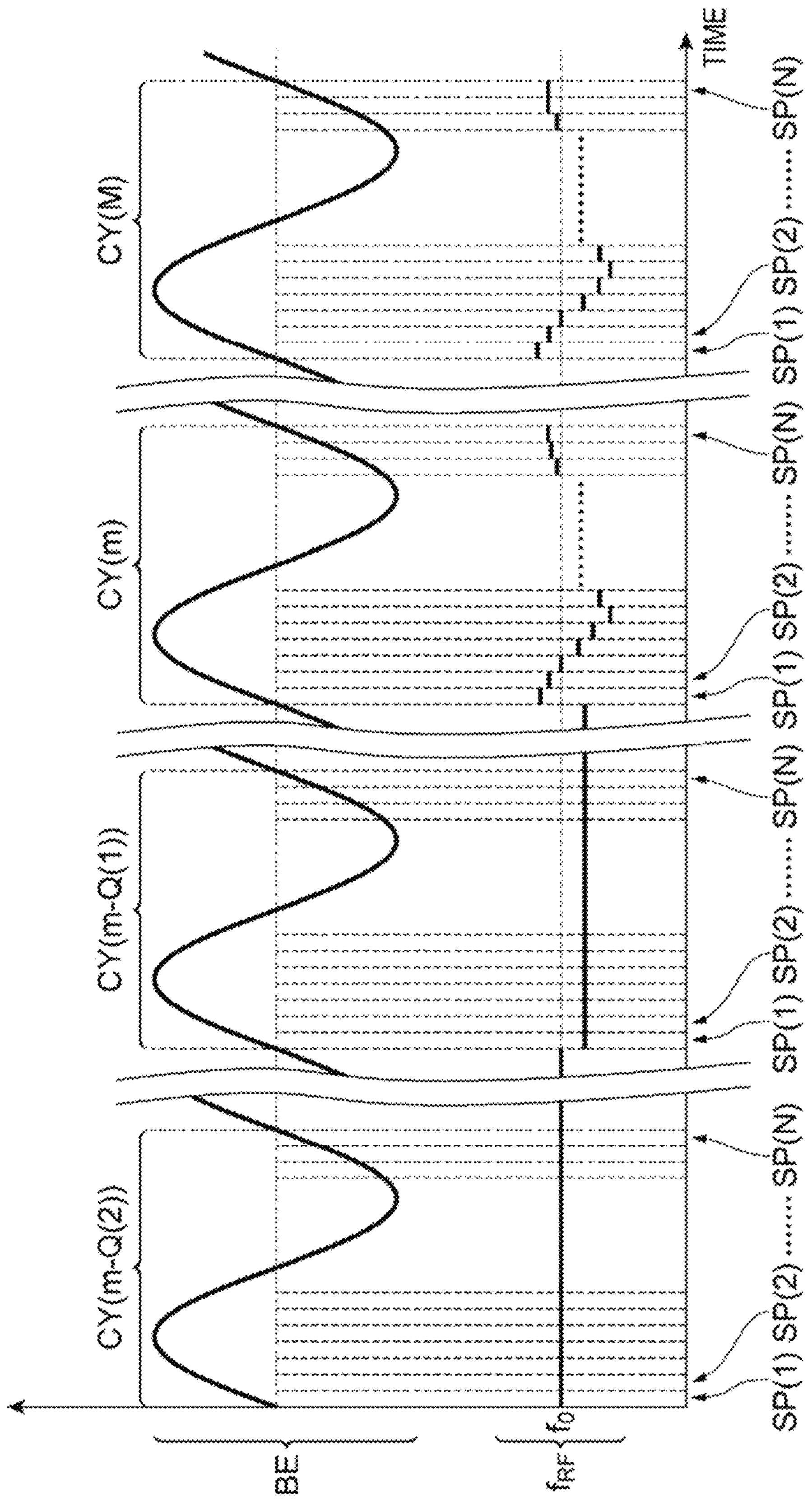
FIG. 9 is a timing chart related to a second example of the source frequency adjustment.

FIG. 9 is a timing chart related to a second example of the adjustment of the source frequency. As illustrated in FIG. 9, in the second example, the control unit 35 is configured to adjust the source frequency $f_{RF}$ of the source radio-frequency power in the phase period SP(n) within the cycle CY(m), i.e., the phase period SP(m,n), according to a change of the representative value RV(n). The change of the representative value RV(n) is specified by using the frequencies of the different source radio-frequency powers RF in the corresponding phase periods SP(n) of two or more cycles CY, respectively, preceding the cycle CY(m).

The two or more cycles CY preceding the cycle CY(m) include a first cycle and a second cycle. In the example of FIG. 9, the first cycle is a cycle CY(m−Q(2)), and the second cycle is a cycle CY(m−Q(1)) subsequent to the first cycle. Q(1) is an integer equal to or larger than 1, Q(2) is an integer equal to or larger than 2, and Q(1)<Q(2) is satisfied.

The control unit 35 gives one frequency shift from the frequency of the source radio-frequency power RF in the phase period SP(m−Q(2),n), to the frequency f(m−Q(1),n) of the source radio-frequency power RF in the phase period SP(m−Q(1),n). Here, f(m,n) represents the frequency of the source radio-frequency power RF used in the phase period SP(m,n). f(m,n) is expressed as f(m,n)=f(m−Q(1),n)+Δ(m, n). Δ(m,n) represents the amount of the frequency shift. The one frequency shift is either one of a frequency decrease and a frequency increase. When the one frequency shift is the frequency decrease, Δ(m,n) has a negative value. When the one frequency shift is the frequency increase, Δ(m,n) has a positive value.

In FIG. 9, the frequencies of the source radio-frequency powers RF in the plurality of respective phase periods SP of the cycle CY (m−Q(2)) are the same at $f_0$, but may be different from each other. Further, in FIG. 9, the frequencies of the source radio-frequency powers RF in the plurality of respective phase periods SP of the cycle CY (m−Q(1)) are the same, and set to a frequency decreased from the frequency $f_0$, but may be increased from the frequency $f_0$.

The control unit 35 identifies the increase or decrease in the degree of reflection of the source radio-frequency power RF (e.g., the power level Pr of the reflected wave) due to the frequency shift, from the change between the representative value RV(m−Q(2),n) and the representative value RV(m−Q(1),n). When the degree of reflection of the source radio-frequency power RF decreases due to the one frequency shift, the control unit 35 sets the frequency f(m,n) to a frequency having the one frequency shift relative to the frequency f(m−Q(1),n).

The amount of one frequency shift Δ(m,n) in the phase period SP(m,n) may be the same as the amount of one frequency shift Δ(m−Q(1),n) in the phase period SP(m−Q(1),n). That is, the absolute value of the amount of frequency shift Δ(m, n) may be the same as the amount of frequency shift Δ(m−Q(1), n). Further, the absolute value of the amount of frequency shift Δ(m,n) may be larger than the amount of frequency shift Δ(m−Q(1),n). Further, the absolute value of the amount of frequency shift Δ(m,n) may be set to increase as the degree of reflection in the phase period SP(m−Q(1),n) increases. For example, the absolute value of the amount of frequency shift Δ(m, n) may be determined by a function of the degree of reflection.

There may be a case where the degree of reflection of the source radio-frequency power RF increases due to the one frequency shift. In this case, the control unit 35 may set the frequency f(m,n) to a frequency having the other frequency shift relative to the frequency f(m−Q(1),n). Further, the frequency of the source radio-frequency power RF in the phase period SP(n) of each of the two or more cycles preceding the cycle CY(m) may be updated to have the one frequency shift relative to the frequency of the source radio-frequency power RF in the phase period SP(n) of the cycle preceding the two or more cycles. In this case, when the degree of reflection of the source radio-frequency power RF in the phase period SP(n) of each of the two or more cycles tends to increase, the other frequency shift may be given to the frequency of the source radio-frequency power RF in the phase period SP(n) of the cycle CY(m). For example, the frequency of the source radio-frequency power RF of the phase period SP(n) of the cycle CY(m) may be set to the frequency having the other frequency shift relative to the frequency of the source radio-frequency power RF of the earliest cycle of the two or more cycles.

When the degree of reflection of the source radio-frequency power RF in the phase period SP(m,n) increases from the degree of reflection of the source radio-frequency power RF in the phase period SP(m−Q(1),n) due to the one frequency shift, the control unit 35 may set the frequency of the source radio-frequency power RF in the phase period CY(m+Q(1)) to an intermediate frequency. The cycle CY(m+Q(1)) is a third cycle subsequent to the cycle CY(m). The intermediate frequency that may be set in the phase period SP(m+Q(1),n) is a frequency between f(m−Q(1),n) and f(m,n), and may be an average value of f(m−Q(1),n) and f(m,n).

There may be a case where the degree of reflection of the source radio-frequency power RF (e.g., the power level Pr of the reflected wave) becomes larger than a predetermined threshold value when the intermediate frequency is used in the phase period SP(m+Q(1),n). In this case, the control unit 35 may set the frequency of the source radio-frequency power RF in the phase period SP(n) of the cycle CY(m+Q(2)) to a frequency having the other frequency shift relative to the intermediate frequency. The cycle CY(m+Q(2)) is a fourth period subsequent to the cycle CY(m+Q(2)). The threshold value is predetermined. The absolute value of the amount of the other frequency shift Δ(m+Q(2),n) is larger than the absolute value of the amount of one frequency shift Δ(m,n). In this case, it is possible to avoid that the amount of reflection of the source radio-frequency power RF cannot be reduced from a local minimum value. Further, the threshold values for the plurality of respective phase periods SP in each of the plurality of cycles CY may be the same or different from each other.

In the second example, the frequency of the source radio-frequency power RF set for each of the phase periods SP(1) to SP(N) in the cycle CY(M) is used as the source frequency $f_{RF}$ for each of the phase periods SP(1) to SP(N) in the subsequent cycle CY.

Third Example of Adjustment of Source Frequency $f_{RF}$

Figure 10:
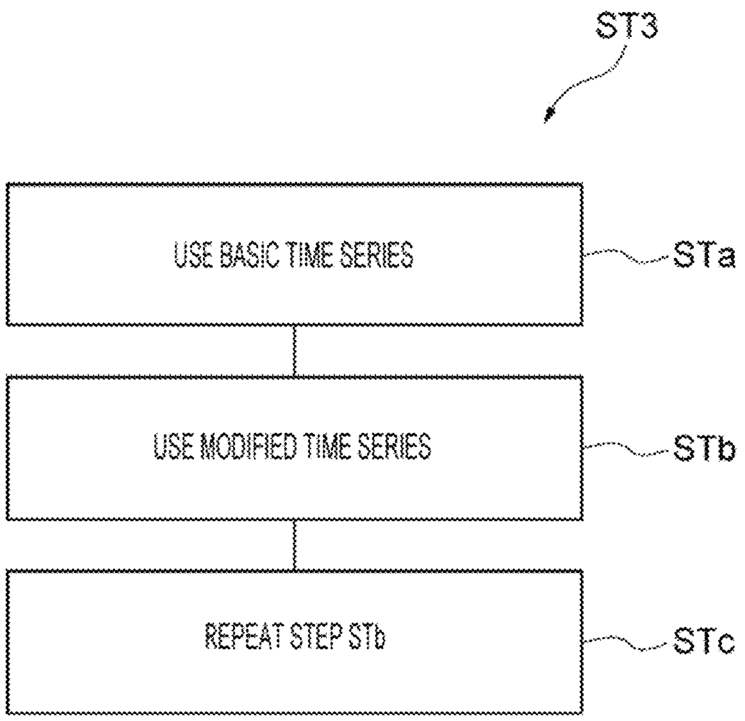
FIG. 10 is a flowchart illustrating a third example of the source frequency adjustment.

FIG. 10 is a flowchart of a third example of the adjustment of the source frequency. FIG. 10 illustrates a third example of the adjustment of the source frequency as an example of step ST3.

Step ST3 illustrated in FIG. 10 includes steps STa to STc. In step STa, a basic time series $TS_B$, which is a predetermined frequency time series, is used as the source frequencies $f_{RF}$ of the source radio-frequency powers RF in the plurality of phase periods SP of the cycle CY. That is, the frequency time series includes a plurality of frequencies, and the plurality of frequencies are used as the source frequencies $f_{RF}$ of the source radio-frequency powers RF of the plurality of respective phase periods SP in the cycle CY. The frequency time series may be specified by the control unit 35. The basic time series $TS_B$ may be prepared by preforming the first or second example of the adjustment of the source frequency $f_{RF}$ as described above.

In step ST3 illustrated in FIG. 10, step STb is performed subsequently. In step STb, a modified time series $TS_M$ is used. That is, a plurality of frequencies included in the time series $TS_M$ is used as the frequencies of the source radio-frequency powers RF of the plurality of respective phase periods SP in the cycle CY. The time series $TS_M$ used in step STb may be specified by the control unit 35. In step STc, step STb is repeated to decrease the degree of reflection of the source radio-frequency power RF from a load according to an evaluation value.

In step STb, a time series TS1, a time series TS2, or a time series TS3 is used as the time series $TS_M$. The time series TS1 is a frequency time series obtained by giving a phase shift amount relative to the cycle CY to the basic time series $TS_B$. The time series TS2 is a frequency time series obtained by scaling (i.e., expanding or contracting) the basic time series $TS_B$ in a frequency direction. The time series TS3 is a frequency time series including the same number of frequencies as the basic time series $TS_B$. The time series TS3 is a frequency time series obtained by scaling (i.e., expanding or contracting) two or more among a plurality of time zones of the basic time series $TS_B$ in a time direction.

The evaluation value is determined by the control unit 35 from the measurement value described above. The evaluation value is a single representative value determined from the measurement value in an evaluation period. The evaluation period is a period during which each frequency time series is continuously used, and may have a time length equal to or longer than the time length of the cycle CY. The evaluation value may be the measurement value in the evaluation period, or an integral value, an average value, or a peak value of a value obtained from the measurement value.

Fourth Example of Adjustment of Source Frequency ($f_{RF}$)

Figure 11:
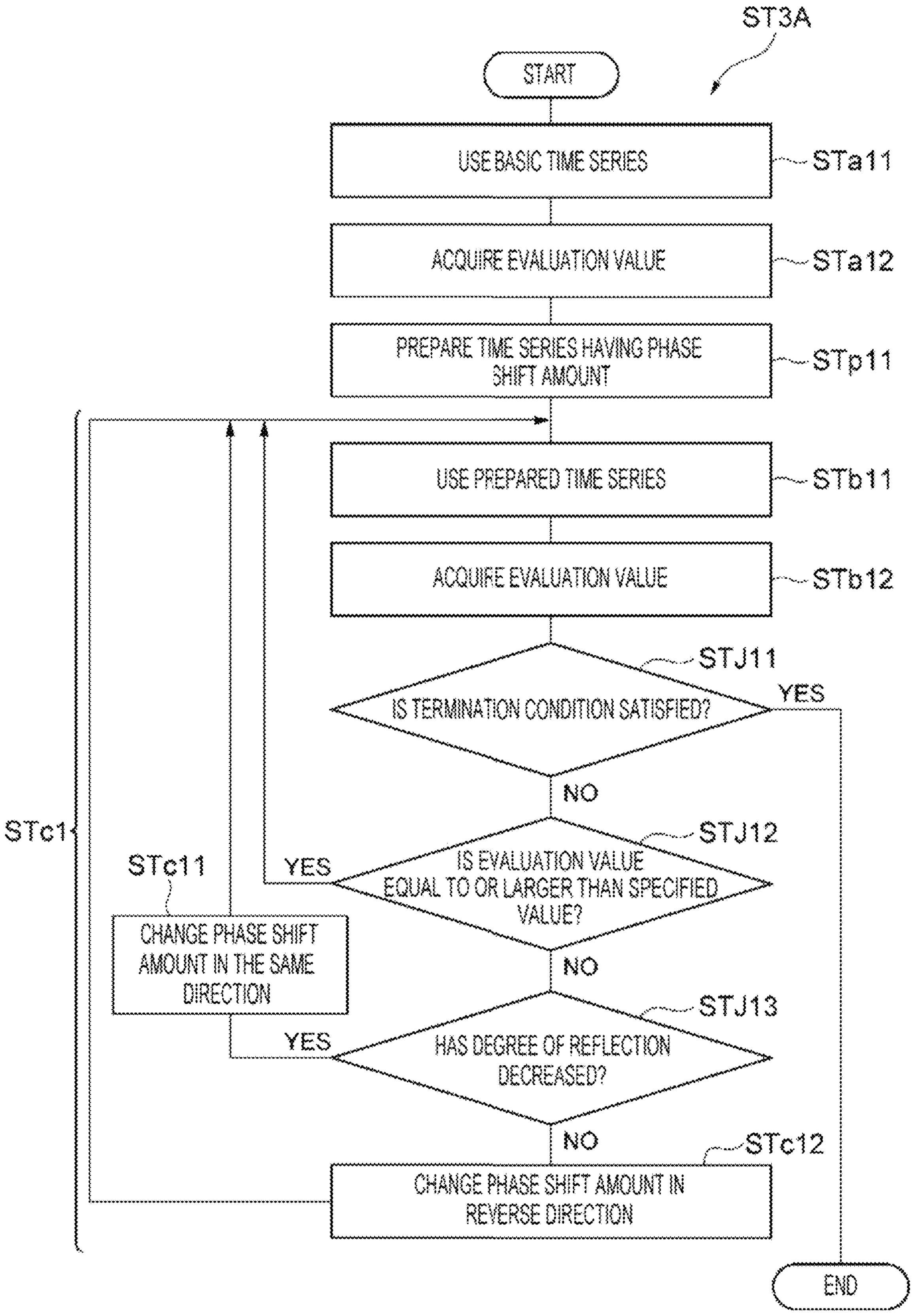
FIG. 11 is a flowchart of a fourth example of the source frequency adjustment.
Figure 12:
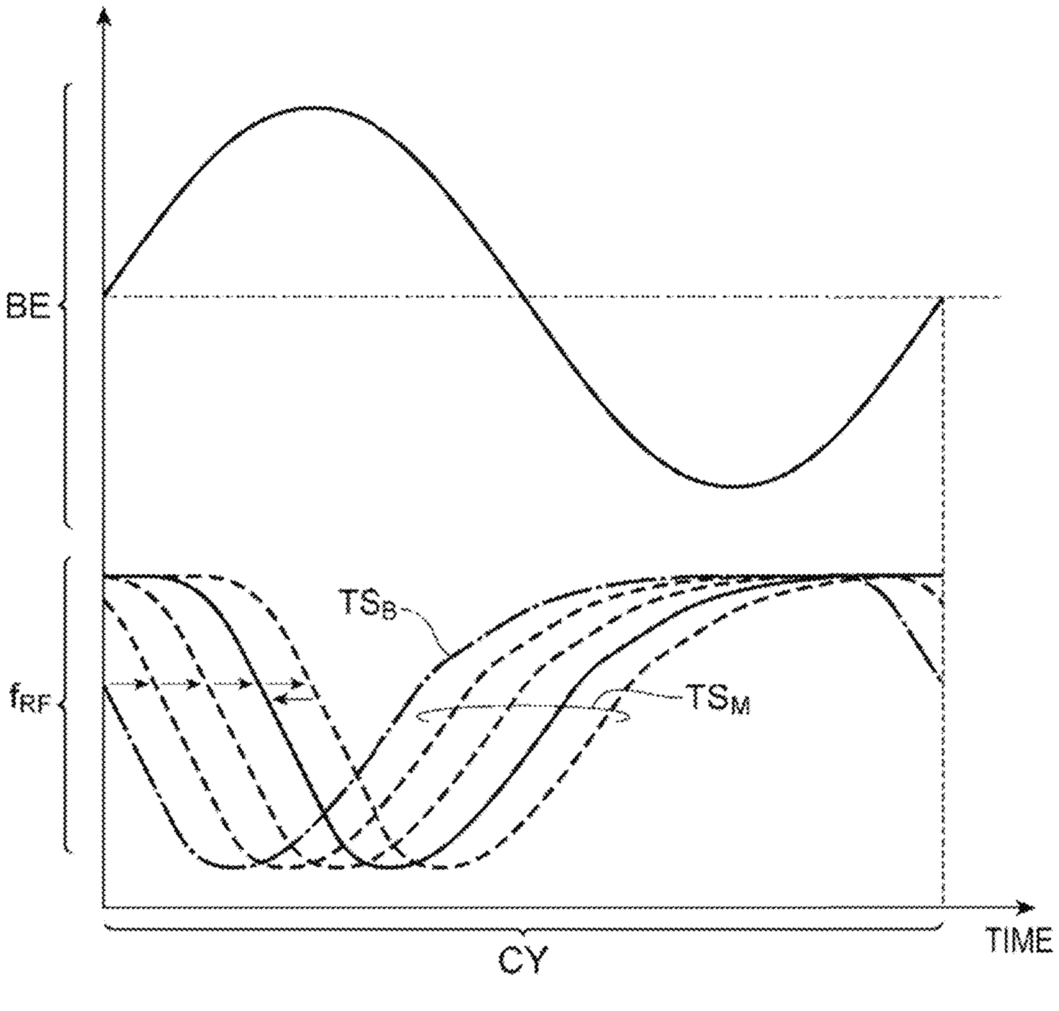
FIG. 12 is a view for explaining the fourth example illustrated in FIG. 11.

Hereinafter, FIGS. 11 and 12 will be referred to. FIG. 11 is a flowchart of a fourth example of the adjustment of the source frequency. FIG. 12 is a view for explaining the fourth example illustrated in FIG. 11. In FIG. 12, the horizontal axis represents time, and the vertical axis represents the electric bias energy BE and the source frequency $f_{RF}$ of the source radio-frequency power RF. FIG. 12 illustrates the waveform of the electric bias energy BE in the cycle CY. Further, FIG. 12 illustrates the basic time series $TS_B$ and the modified time series $TS_M$, which are used as the source frequencies $f_{RF}$ of the source radio-frequency powers RF of the plurality of respective phase periods SP within the cycle CY. Step ST3A illustrated in FIG. 11 may be used as step ST3 illustrated in FIG. 10. In step ST3A, the time series TS1 described above is used as the modified time series $TS_M$.

Step ST3A starts with step STa11 as illustrated in FIG. 11. In step STa11, the basic time series $TS_B$ is used as described above for step STa. That is, the plurality of frequencies included in the basic time series $TS_B$ are used as the source frequencies $f_{RF}$ of the source radio-frequency powers RF of the plurality of phase periods SP within the cycle CY.

Next, step STa12 is performed. In step STa12, the evaluation value described above is determined by the control unit 35 from the measurement value when the basic time series $TS_B$ is used as described above.

Next, step STp11 is performed. In step STp11, the time series $TS_M$ is prepared, which is obtained by giving the phase shift amount to the basic time series $TS_B$ for the cycle CY. The time series $TS_M$ is prepared by the control unit 35.

Next, step STb11 is performed. In step STb11, the prepared time series $TS_M$ is used. That is, the plurality of frequencies included in the time series $TS_M$ are used as the source frequencies $f_{RF}$ of the source radio-frequency powers of the plurality of respective phase periods SP within the cycle CY. Then, in step STc1, step STb11 is repeated while changing the phase shift amount.

In step STc1, step STb12 is performed after step STb11. In step STb12, the evaluation value during the performance of step STb11, i.e., the evaluation period, is acquired by the control unit 35.

In step STc1, step STJ11 is performed subsequently. In step STJ11, it is determined whether a termination condition is satisfied. The determination in step STJ11 is performed by the control unit 35. In step STJ11, the termination condition is satisfied when an instruction to terminate the plasma processing is made from the main control unit 2.

When it is determined in step STJ11 that the termination condition is not satisfied, step STJ12 is performed. In step STJ12, it is determined whether the evaluation value acquired in step STb12 is equal to or less than a specified value. The determination in step STJ12 is performed by the control unit 35. When the evaluation value is equal to or less than the specified value, this indicates that the degree of reflection of the source radio-frequency power from a load is sufficiently small. When it is determined in STJ12 that the evaluation value is equal to or less than the specified value, the process is repeated from step STb11. Meanwhile, when it is determined in step STJ12 that the evaluation value is larger than the specified value, step STJ13 is performed.

In step STJ13, the evaluation value acquired in step STb12 and the previously acquired evaluation value are compared with each other, to determine whether the degree of reflection of the source radio-frequency power RF from a load has decreased. The determination in step STJ13 is performed by the control unit 35. When it is determined in step STJ13 that the degree of reflection of the source radio-frequency power RF from a load has decreased, step STc11 is performed. Meanwhile, when it is determined in step STJ13 that the degree of reflection of the source radio-frequency power RF from a load has not decreased, step STc12 is performed.

In step STc11, the phase shift amount is changed in the same direction as the previously used phase shift amount. When the previously used phase shift amount has increased relative to the phase shift amount used before the previously used phase shift amount, the phase shift amount is increased in step STc11 as indicated by the rightward arrow in FIG. 12. When the previously used phase shift amount has decreased relative to the phase shift amount used before the previously used phase shift amount, the phase shift amount is decreased in step STc11. Then, the time series $TS_M$ is prepared, which is obtained by giving the changed phase shift amount to the basic time series $TS_B$. The time series $TS_M$ is prepared by the control unit 35. Then, step STb11 is performed again.

In step STc12, the phase shift amount is changed in the reverse direction to the previously used phase shift amount.

When the previously used phase shift amount has increased relative to the phase shift amount used before the previously used phase shift amount, the phase shift amount is decreased in step STc12 as indicated by the leftward arrow in FIG. 12. When the previously used phase shift amount has decreased relative to the phase shift amount used before the previously used phase shift amount, the phase shift amount is increased in step STc12. Then, the time series $TS_M$ is prepared, which is obtained by giving the changed phase shift amount to the basic time series $TS_B$. The time series $TS_M$ is prepared by the control unit 35. Then, step STb11 is performed again.

When step STb11 is repeated, and it is determined in step STJ11 that the termination condition is satisfied, step ST3A is terminated.

Fifth Example of Adjustment of Source Frequency $f_{RF}$

Figure 13:
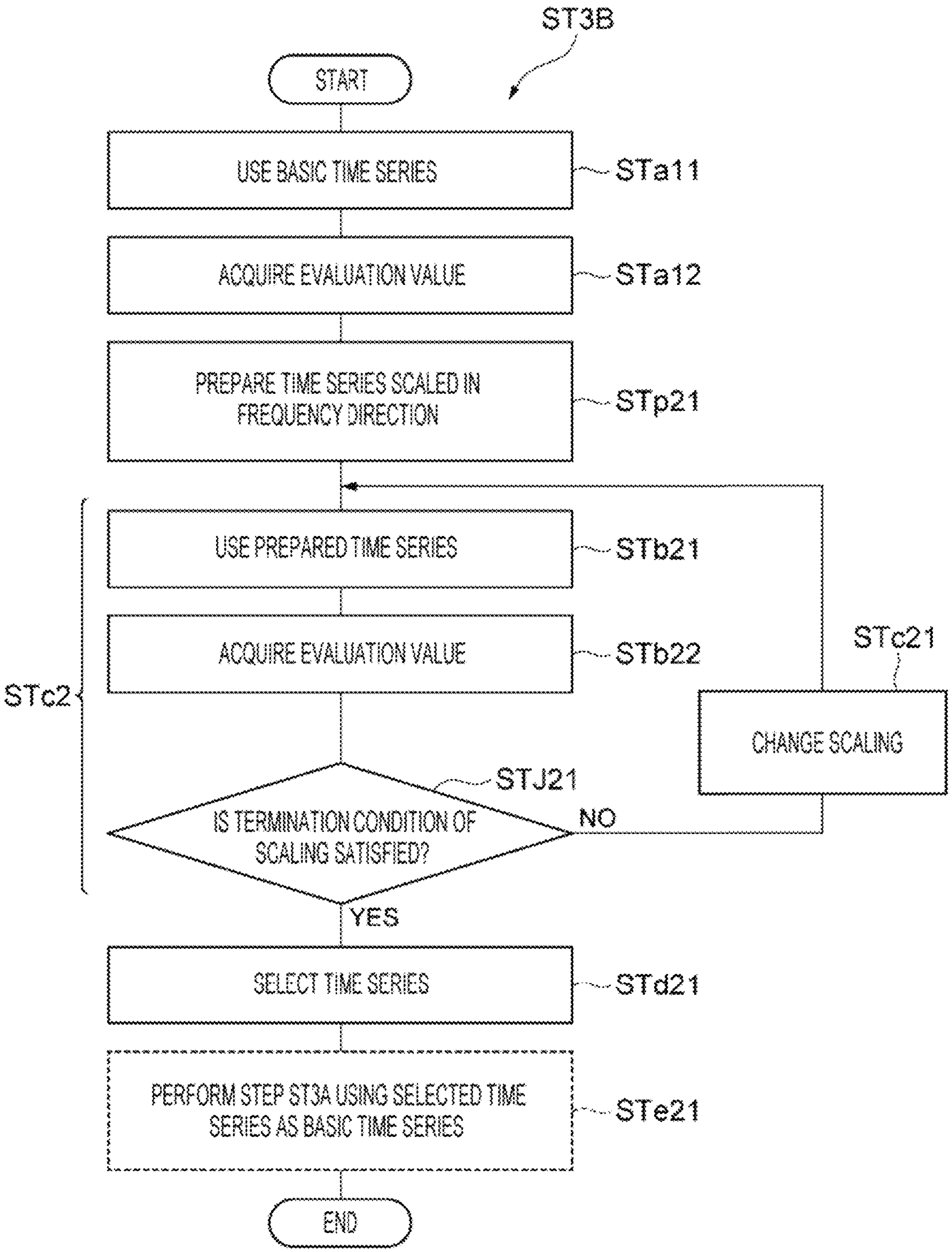
FIG. 13 is a flowchart of a fifth example of the source frequency adjustment.

Hereinafter, FIGS. 13 to 17 will be referred to. FIG. 13 is a flowchart of a fifth example of the adjustment of the source frequency. FIGS. 14 to 17 are each a view for explaining the fifth example. In each of FIGS. 14 to 17, the horizontal axis represents time, and the vertical axis represents the electric bias energy BE and the source frequency $f_{RF}$ of the source radio-frequency power RF. Each of FIGS. 14 to 17 illustrates the waveform of the electric bias energy BE in the cycle CY. Further, each of FIGS. 14 to 17 illustrates the basic time series $TS_B$ and the modified time series $TS_M$, which are used as the source frequencies $f_{RF}$ of the source radio-frequency powers RF of the plurality of respective phase periods SP within the cycle CY. Step ST3B illustrated in FIG. 13 may be used as step ST3 illustrated in FIG. 10. In step ST3B, the time series TS2 described above is used as the modified time series $TS_M$.

As illustrated in FIG. 13, step ST3B starts with step STa11, similar to step ST3A. Subsequently, step STa12 is performed, similar to step ST3A.

Next, step STp21 is performed. In step STp21, the time series $TS_M$ is prepared, which is obtained by scaling, i.e., expanding or contracting, the basic time series $TS_B$ in the frequency direction. The time series $TS_M$ is prepared by the control unit 35.

Figure 14:
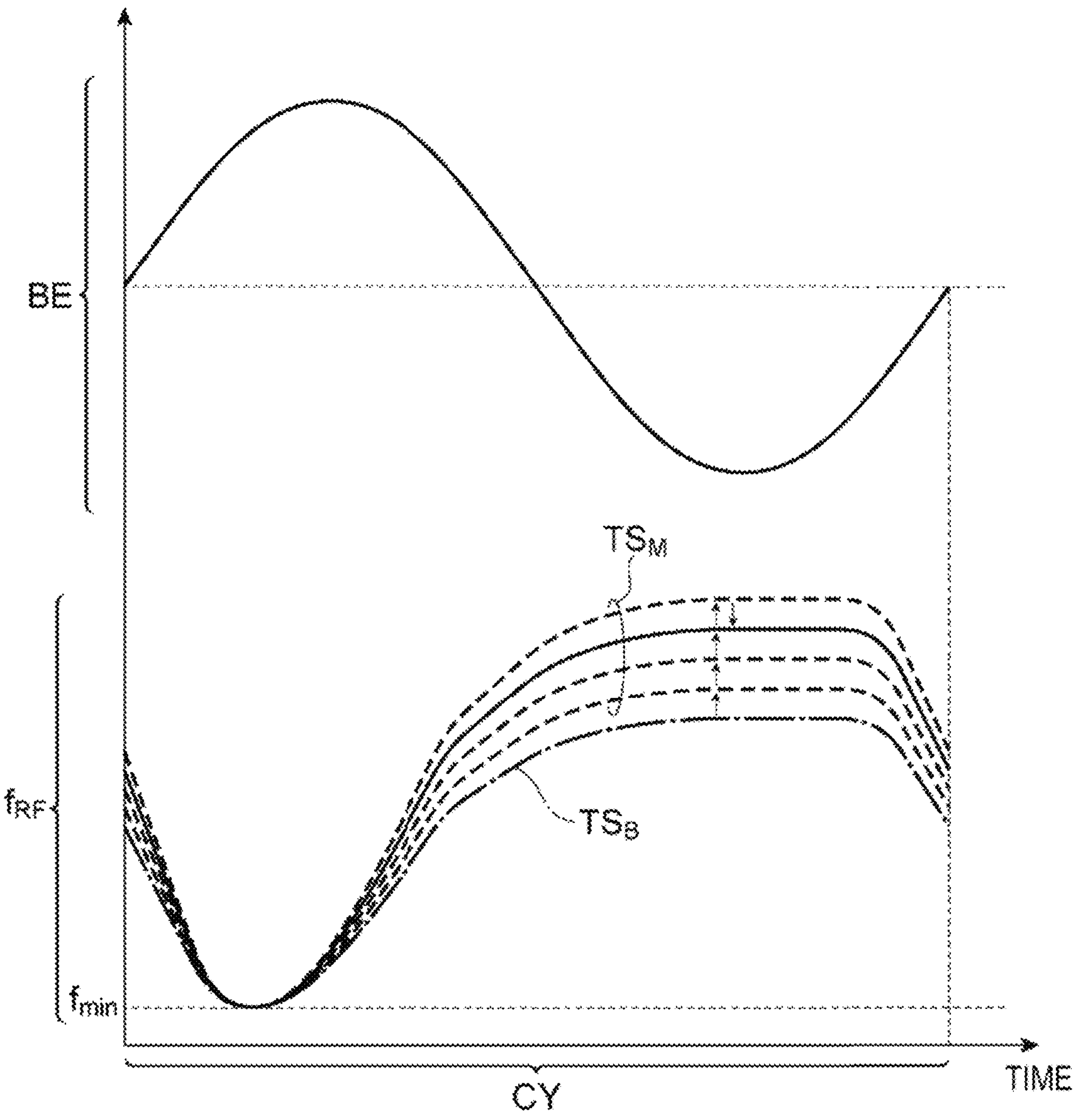
FIG. 14 is a view for explaining the fifth example.
Figure 15:
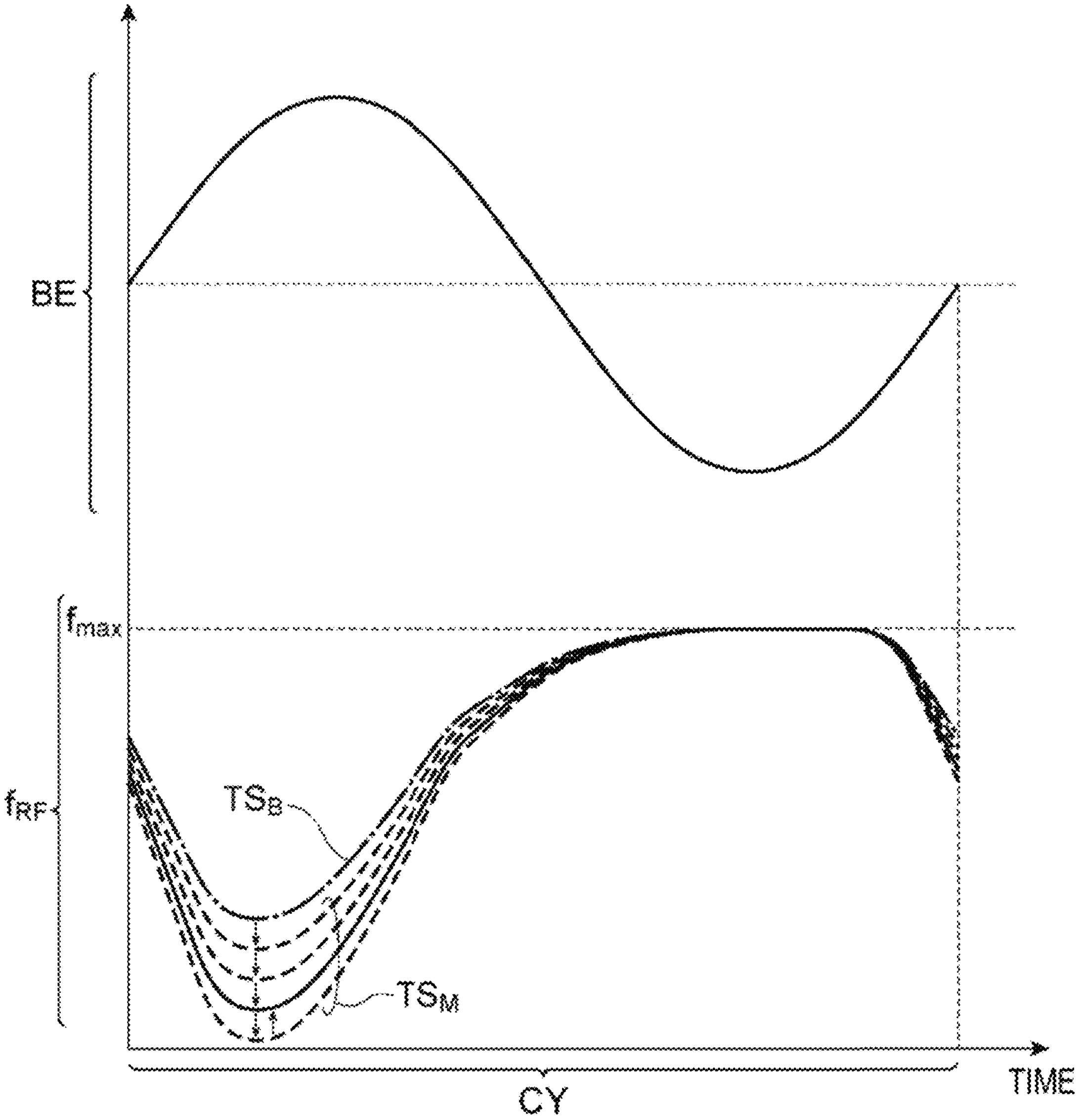
FIG. 15 is a view for explaining the fifth example.
Figure 16:
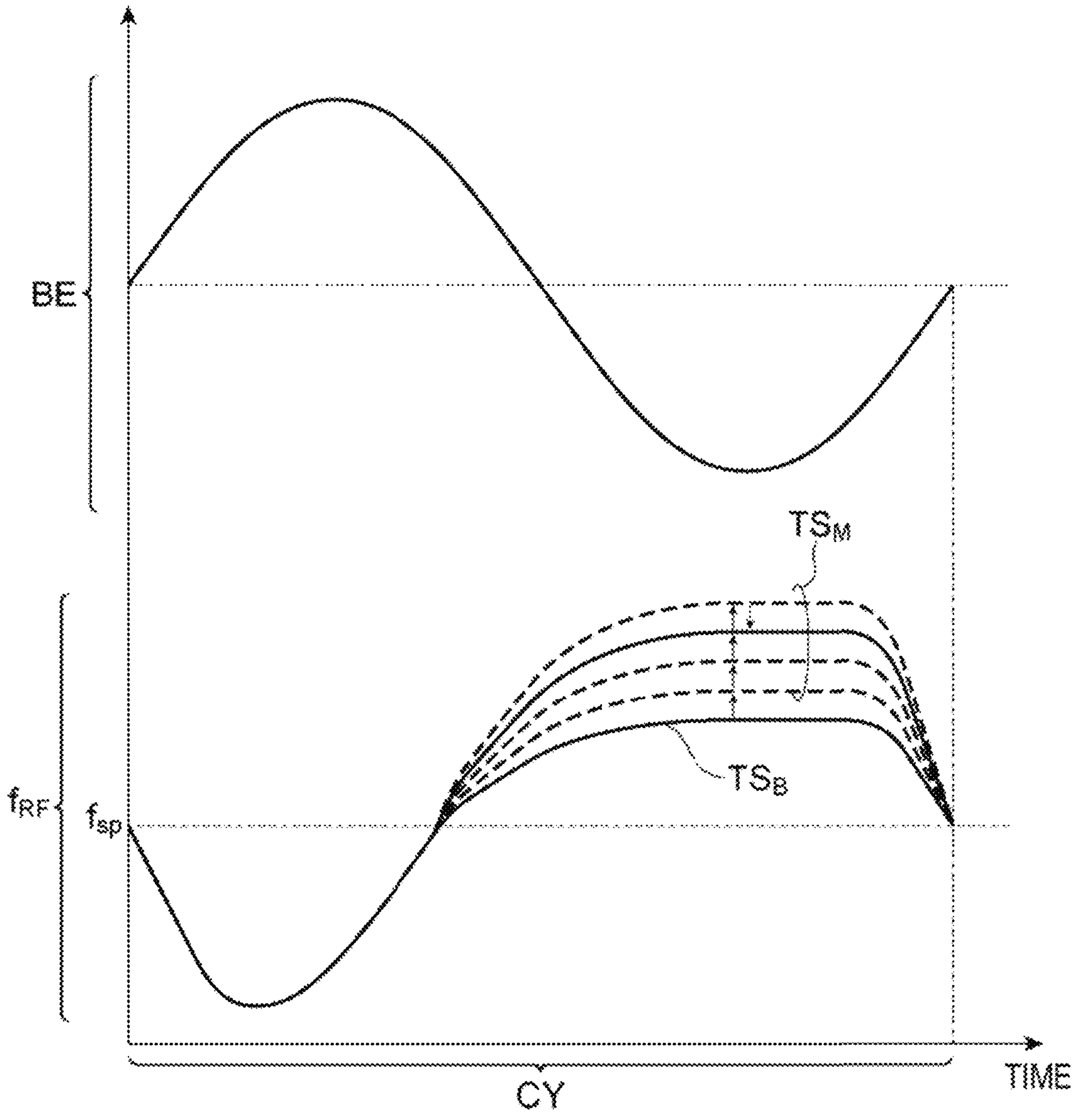
FIG. 16 is a view for explaining the fifth example.
Figure 17:
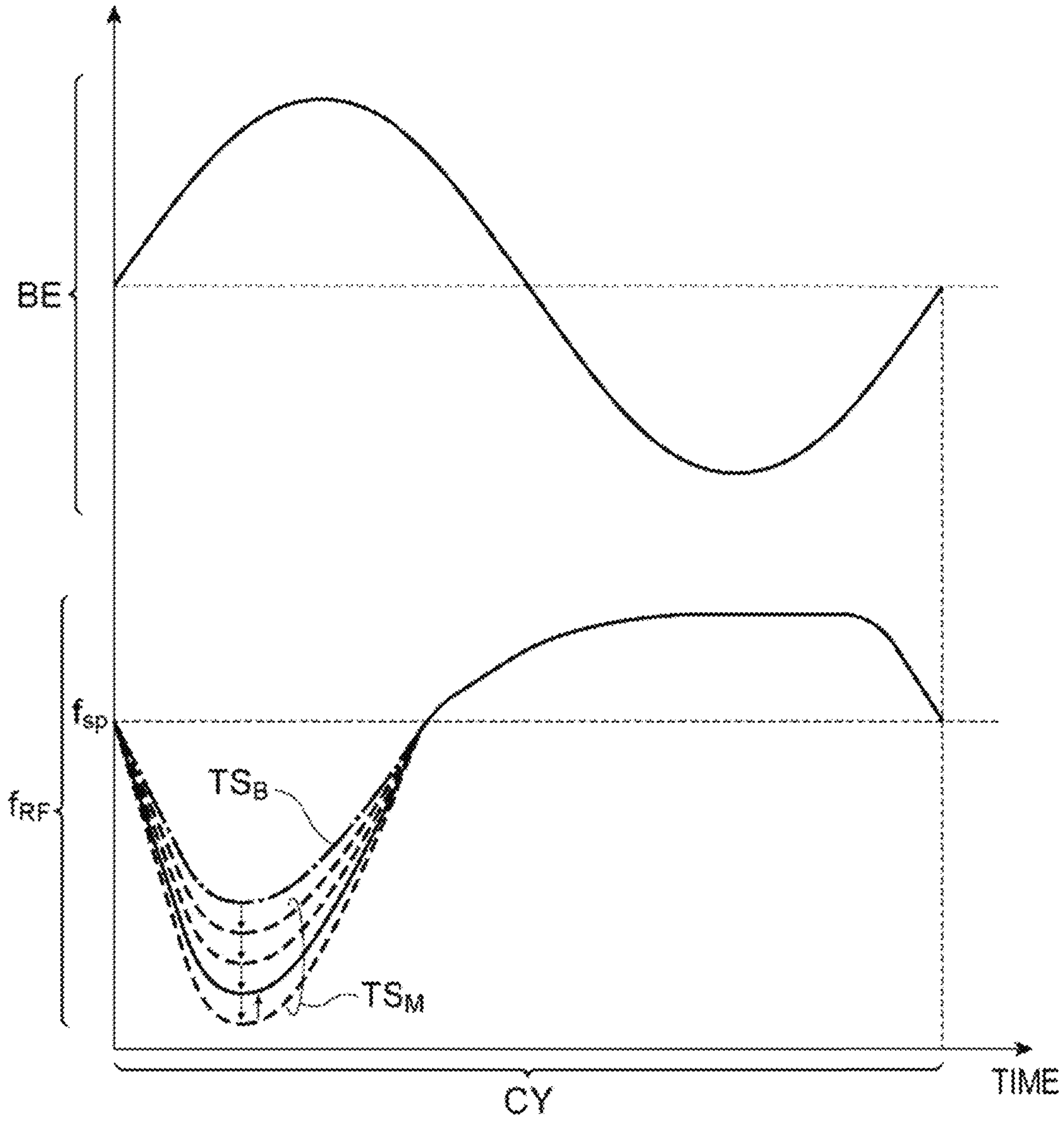
FIG. 17 is a view for explaining the fifth example.

The time series $TS_M$ prepared in step STp21 may be a time series obtained by scaling the basic time series $TS_B$ in the frequency direction while maintaining the minimum frequency $f_{min}$ in the basic time series $TS_B$, as illustrated in FIG. 14. In the descriptions hereinafter, the time series modified as illustrated in FIG. 14 will be referred to as a time series TS21. The time series $TS_M$ prepared in step STp21 may be a time series obtained by scaling the basic time series $TS_B$ in the frequency direction while maintaining the maximum frequency $f_{max}$ in the basic time series $TS_B$, as illustrated in FIG. 15. In the descriptions hereinafter, the modified time series as illustrated in FIG. 15 will be referred to as a time series TS22. The time series $TS_M$ prepared in step STp21 may be a time series obtained by scaling the basic time series $TS_B$ in the frequency direction while maintaining a frequency equal to or lower than a specified frequency $f_{sp}$ in the basic time series $TS_B$, as illustrated in FIG. 16. In the descriptions hereinafter, the modified time series as illustrated in FIG. 16 will be referred to as a time series TS23. The time series $TS_M$ prepared in step STp21 may be a time series obtained by scaling the basic time series $TS_B$ in the frequency direction while maintaining a frequency equal to or higher than the specified frequency $f_{sp}$ in the basic time series $TS_B$, as illustrated in FIG. 17. In the descriptions hereinafter, the time series modified as illustrated in FIG. 17 will be referred to as a time series TS24.

Next, step STb21 is performed. In step STb21, the prepared time series $TS_M$ is used as described above for step STb. That is, the plurality of frequencies included in the time series $TS_M$ are used as the source frequencies $f_{RF}$ of the source radio-frequency powers RF of the plurality of respective phase periods SP in the cycle CY. Then, in step STc2, step STb21 is repeated. In repeating step STb21, the control unit 35 changes the magnification of the scaling of the basic time series $TS_B$ in the frequency direction.

In repeating step STb21, any one of the time series TS21 to TS24 may be used, and the magnification of the scaling may be changed. In repeating step STb21, the time series TS21 to TS24 may be used in sequence while changing the magnification of the scaling.

In step STc2, step STb22 is performed after step STb21. Step STb22 is the same as step STb12.

In step STc2, step STJ21 is performed after step STb22. In step STJ21, it is determined whether a termination condition of the scaling is satisfied. The determination in step STJ21 is performed by the control unit 35. In step STJ21, the termination condition of the scaling is satisfied when step STb21 is repeated a predetermined number of times.

When it is determined in step STJ21 that the termination condition of the scaling is not satisfied, step STc21 is performed. In step STc21, the time series $TS_M$ is prepared by changing the magnitude of the scaling in the frequency direction for the basic time series $TS_B$ as indicated by the arrows in FIGS. 14 to 17. The time series $TS_M$ is prepared by the control unit 35. Meanwhile, when it is determined in step STJ21 that the termination condition of the scaling is satisfied, step STd21 is performed.

In step STd21, a time series $TS_M$ (first time series) that minimizes the degree of reflection of the source radio-frequency power RF is selected based on a plurality of obtained evaluation values. The control unit 35 uses the plurality of frequencies included in the selected time series $TS_M$ as the source frequencies $f_{RF}$ of the source radio-frequency power RF of the plurality of respective phase periods SP within the cycle CY. After step STd21, step ST3B may be terminated. Alternatively, step STe21 may be performed after step STd21. In step STe21, step ST3A is performed using the time series $TS_M$ selected in step STd21 as the basic time series.

Sixth Example of Adjustment of Source Frequency $f_{RF}$

Figure 18:
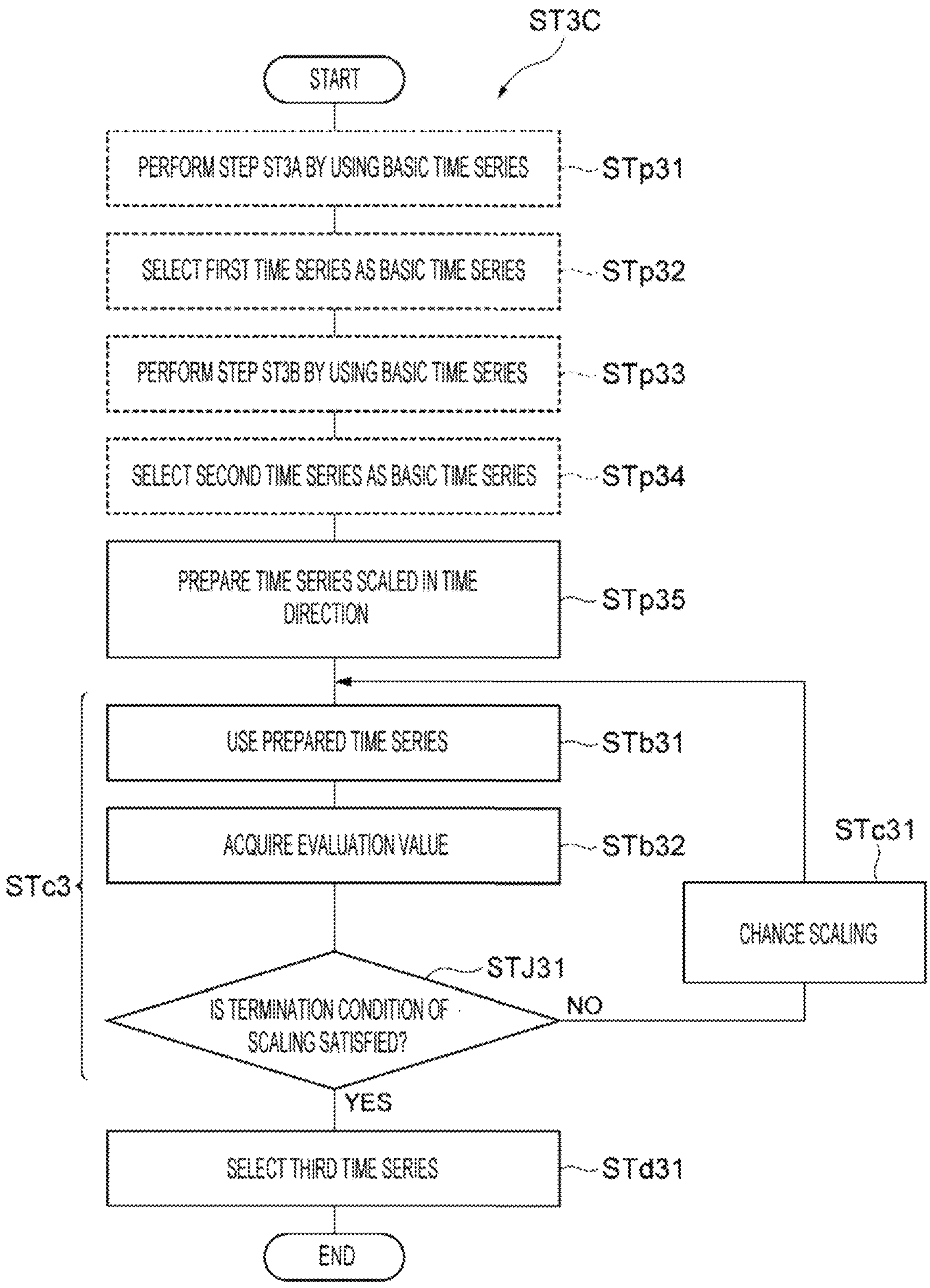
FIG. 18 is a flowchart of a sixth example of the source frequency adjustment.
Figure 19:
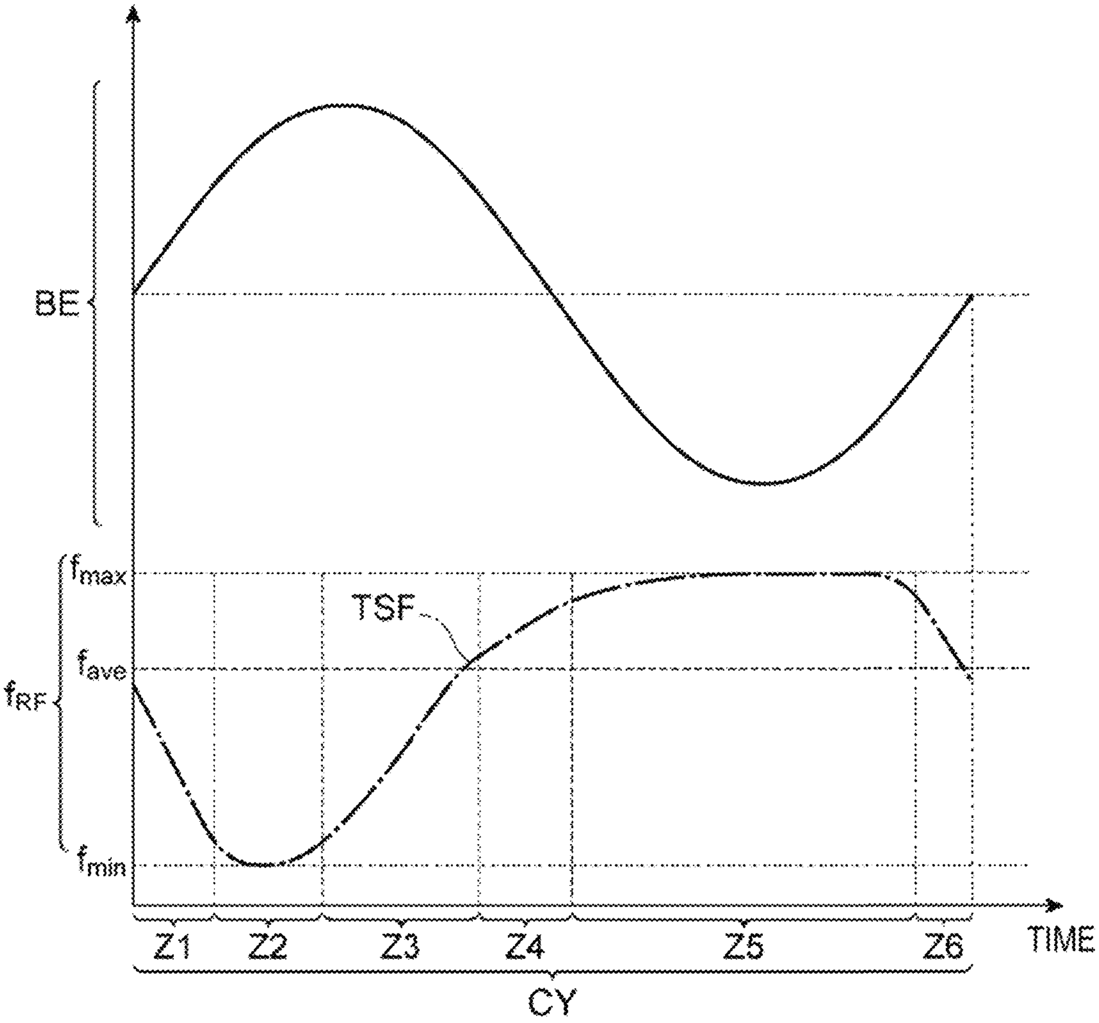
FIG. 19 is a view for explaining the sixth example.

Hereinafter, FIGS. 18 and 19 will be referred to. FIG. 18 is a flowchart of a sixth example of the adjustment of the source frequency. FIG. 19 is a view for explaining the sixth example. In FIG. 19, the horizontal axis represents time, and the vertical axis represents the electric bias energy BE and the source frequency $f_{RF}$ of the source radio-frequency power RF. FIG. 19 illustrates the waveform of the electric bias energy BE in the cycle CY. Further, FIG. 19 illustrates the basic time series $TS_B$ and the modified time series $TS_M$, which are used as the source frequencies $f_{RF}$ of the source radio-frequency powers RF of the plurality of respective phase periods SP within the cycle CY. Step ST3C illustrated in FIG. 18 may be used as step ST3 illustrated in FIG. 10. In step ST3C, the time series TS3 described above is used as the modified time series $TS_M$.

Step ST3C starts with step STp31. In step STp31, step ST3A is performed using the basic time series $TS_B$. Subsequently, step STp32 is performed. In step STp32, among the plurality of time series used in step STp31, a time series $TS_M$ (first time series) that minimizes the degree of reflection of the source radio-frequency power RF is identified based on the plurality of evaluation values obtained in step STp31, and selected as the basic time series.

Next, step STp33 is performed. In step STp33, step ST3B is performed using the basic time series selected in step STp32. Subsequently, step STp34 is performed. In step STp34, among the plurality of time series used in step STp33, a time series $TS_M$ (second time series) that minimizes the degree of reflection of the source radio-frequency power RF is identified based on the plurality of evaluation values obtained in step STp33, and selected as the basic time series.

Next, step STp35 is performed. In step STp35, the modified time series $TS_M$ is prepared, which includes the same number of frequencies as the basic time series $TS_B$, by scaling (expanding or contracting) two or more of a plurality of time zones in the basic time series selected in step STp34 in the time direction. In step STp35, the time series $TS_M$ is prepared by the control unit 35. Instead of steps STp31 to STp34, steps STa11 and STa12 may be performed to prepare the time series $TS_M$ from the basic time series $TS_B$ in step STp35.

The plurality of time zones may include zones Z1 to Z6, as illustrated in FIG. 19. In order to determine the zones Z1 to Z6, the minimum frequency $f_{min}$, the maximum frequency $f_{max}$, and the average frequency $f_{ave}$ of the basic time series used in step STp35 are identified. Then, the difference between the minimum frequency $f_{min}$ and the maximum frequency $f_{max}$ included in the basic time series, i.e., the frequency width, is calculated. Then, a zone Z2 is determined to be a time zone corresponding to the range from the minimum frequency $f_{min}$ to a value obtained by adding 10% of the frequency width to the minimum frequency $f_{min}$. Further, a zone Z5 is determined to be a time zone corresponding to the range from a value obtained by subtracting 10% of the frequency width from the maximum frequency $f_{max}$ to the maximum frequency $f_{max}$. Further, a zone Z1 is determined to be a time zone from the start time point of the cycle CY to the start time point of the zone Z2. Further, a zone Z3 is determined to be a time zone from the end time point of the zone Z2 to the time point corresponding to the average frequency $f_{ave}$. Further, a zone Z4 is determined to be a time zone from the time point corresponding to the average frequency $f_{ave}$ to the start time point of the zone Z5. Further, a zone Z6 is determined to be a time zone from the end time point of the zone Z5 to the end time point of the cycle CY.

In step STp35, the zone Z2 of the basic time series may be expanded in the time direction. The zones Z1 and Z3 of the basic time series may be contracted in the time direction, in order to generate the modified time series $TS_M$ including the same number of frequencies as the basic time series $TS_B$.

Next, step STb31 is performed. In step STb31, the prepared time series $TS_M$ is used as described above for step STb. That is, the plurality of frequencies included in the time series $TS_M$ are used as the source frequencies $f_{RF}$ of the source radio-frequency powers RF of the plurality of respective phase periods SP in the cycle CY. Then, in step STc3, step STb31 is repeated. In repeating step STb31, the control unit 35 changes the magnification of the scaling in the time direction for two or more of the plurality of time zones of the basic time series.

In step STc3, step STb32 is performed after step STb31. Step STb32 is the same as step STb12. Subsequently, step STJ31 is performed. In step STJ31, it is determined whether the termination condition of the scaling is satisfied. In step STJ31, the termination condition of the scaling is satisfied when step STb31 is repeated a predetermined number of times.

When it is determined in step STJ31 that the termination condition of the scaling is not satisfied, step STc31 is performed. In step STc31, the time series $TS_M$ is prepared by changing the magnification of the scaling in the time direction for two or more of the plurality of time zones of the basic time series. The time series $TS_M$ is prepared by the control unit 35. The prepared time series $TS_M$ is used in step STb31. Meanwhile, when it is determined in step STJ31 that the termination condition of the scaling is satisfied, step STd31 to be described later is performed.

In repeating step STb31, as in step STp35, the zone Z2 of the basic time series may be expanded in the time direction, and the zones Z1 and Z3 of the basic time series may be contracted in the time direction, while changing the magnification of the scaling of the zone Z2 in the time direction. This process is performed until it is determined from the evaluation value acquired in step STb32 that the degree of reflection of the source radio-frequency power RF no longer decreases.

Then, in repeating step STb31, the zone Z5 of the basic time series may be expanded in the time direction, and the zones Z4 and Z6 of the basic time series may be contracted in the time direction, while changing the magnification of the scaling of the zone Z5 in the time direction. This process is performed until it is determined from the evaluation value acquired in step STb32 that the degree of reflection of the source radio-frequency power RF no longer decreases.

In step STd31, a time series $TS_M$ that minimizes the degree of reflection of the source radio-frequency power RF is identified from the plurality of evaluation values obtained in step STc3, and selected as a third time series. The selection of the third time series in step STd31 is performed by the control unit 35. Then, the plurality of frequencies included in the selected time series (the third time series) are used as the source frequencies $f_{RF}$ of the source radio-frequency powers RF of the plurality of respective phase periods SP in the cycle CY. Further, the process from step STp31 may be repeated using the third time series as the basic time series.

Seventh Example of Adjustment of Source Frequency $f_{RF}$

Hereinafter, FIGS. 20A, 20B, 21A, 21B, and 22 will be referred to. FIGS. 20A, 20B, 21A, and 21B are each a timing chart illustrating an example of the source radio-frequency power and the electric bias energy. FIG. 22 is a timing chart related to a seventh example of the adjustment of the source frequency. In these figures, "ON" of the source radio-frequency power RF indicates that the source radio-frequency power RF is being supplied to the radio-frequency electrode, and "OFF" of the source radio-frequency power RF indicates that the supply of the source radio-frequency power RF is stopped. The "HIGH" of the source radio-frequency power RF indicates that the source radio-frequency power RF having the higher level than the level of the source radio-frequency power RF indicated by "LOW" is being supplied to the radio-frequency electrode. Further, "ON" of the electric bias energy BE indicates that the electric bias energy BE is being given to the bias electrode, and "OFF" of the electric bias energy BE indicates that the electric bias energy BE is not given to the bias electrode.

Further, "HIGH" of the electric bias energy BE indicates that the electric bias energy BE having the higher level than the level of the electric bias energy BE indicated by "LOW" is given to the bias electrode.

In the examples of FIGS. 20A, 20B, 21A, and 21B as well, the electric bias energy BE is supplied to the bias electrode as an ON/OFF pulse or a HIGH/LOW pulse. The frequency of the ON/OFF or HIGH/LOW pulse is lower than the bias frequency, and for example, 1 kHz or higher and 100 kHz or lower.

The bias power supply 32 supplies the electric bias energy BE in the ON or HIGH state, in the period during which a first control signal given from the main control unit 2 has a first state (e.g., an ON state). The bias power supply 32 sets the electric bias energy BE to the OFF or LOW state, in the period during which the first control signal has a second state (e.g., an OFF state). The period during which the first control signal has the first state may or may not be synchronized with the first clock signal.

When the period during which the first control signal has the first state and the first clock signal are not synchronized with each other, the supply of the electric bias energy BE in the ON or HIGH state may start at the timing specified by the first clock signal immediately after the state of the first control signal enters the first state. Meanwhile, when the period during which the first control signal has the first state and the first clock signal are synchronized with each other, the bias power supply 32 starts the supply of the electric bias energy BE when the state of the first control signal enters the first state.

The bias power supply 32 may set the electric bias energy BE to the OFF or LOW state when the state of the first control signal changes from the first state to the second state. Alternatively, the bias power supply 32 may set the electric bias energy BE to the OFF or LOW state at the end timing of the cycle CY of the ongoing electric bias energy BE when the state of the first control signal changes from the first state to the second state.

Figure 20A:
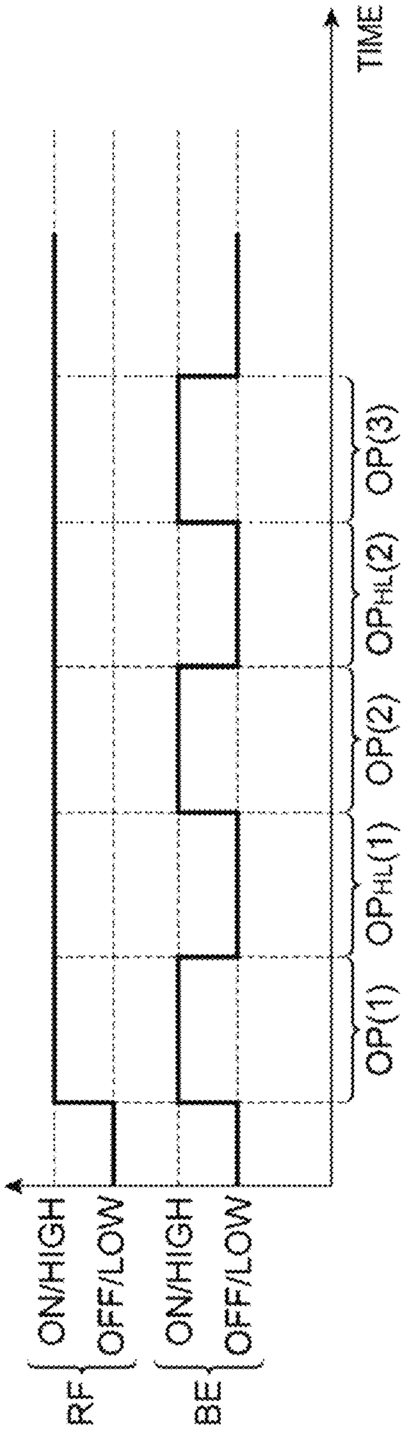
FIGS. 20A and 20B are each a timing chart illustrating an example of a source radio-frequency power and an electric bias energy.

As illustrated in FIG. 20A, the source radio-frequency power RF may be supplied as a continuous wave to the radio-frequency electrode. In the example illustrated in FIG. 20A, the source radio-frequency power RF and the electric bias energy BE in the ON or HIGH state are supplied simultaneously in the plurality of overlap periods OP.

Figure 20B:
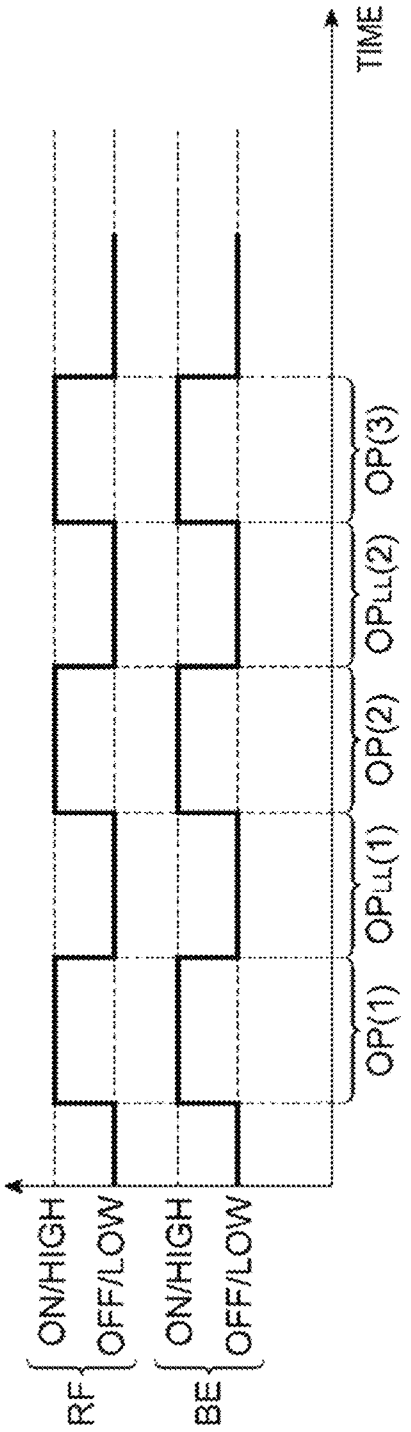
Figure 21A:
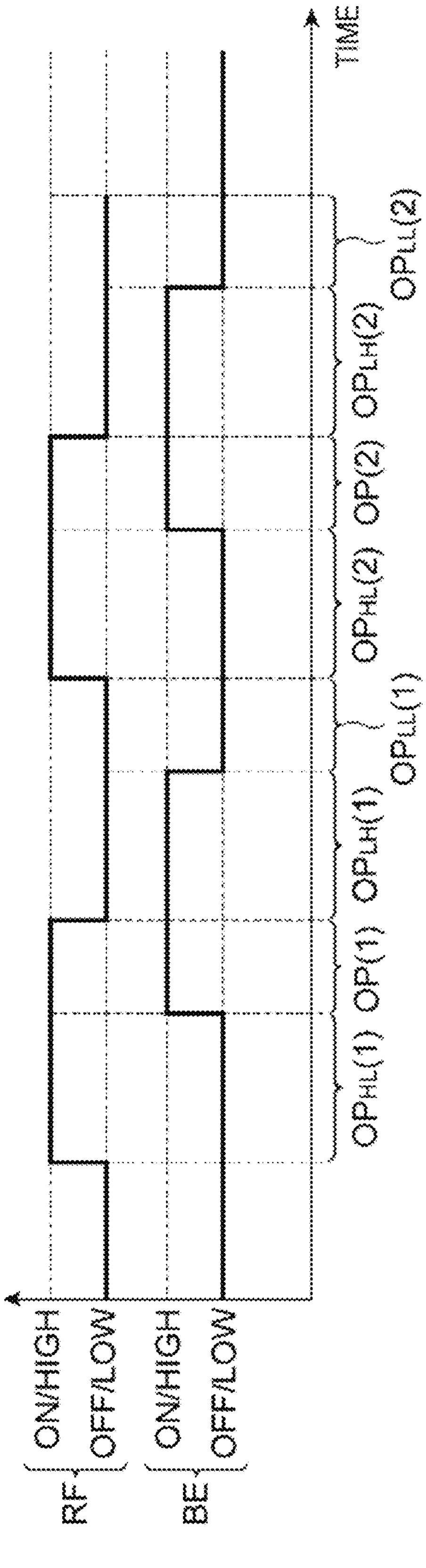
FIGS. 21A and 21B are each a timing chart illustrating the source radio-frequency power and the electric bias energy.
Figure 21B:
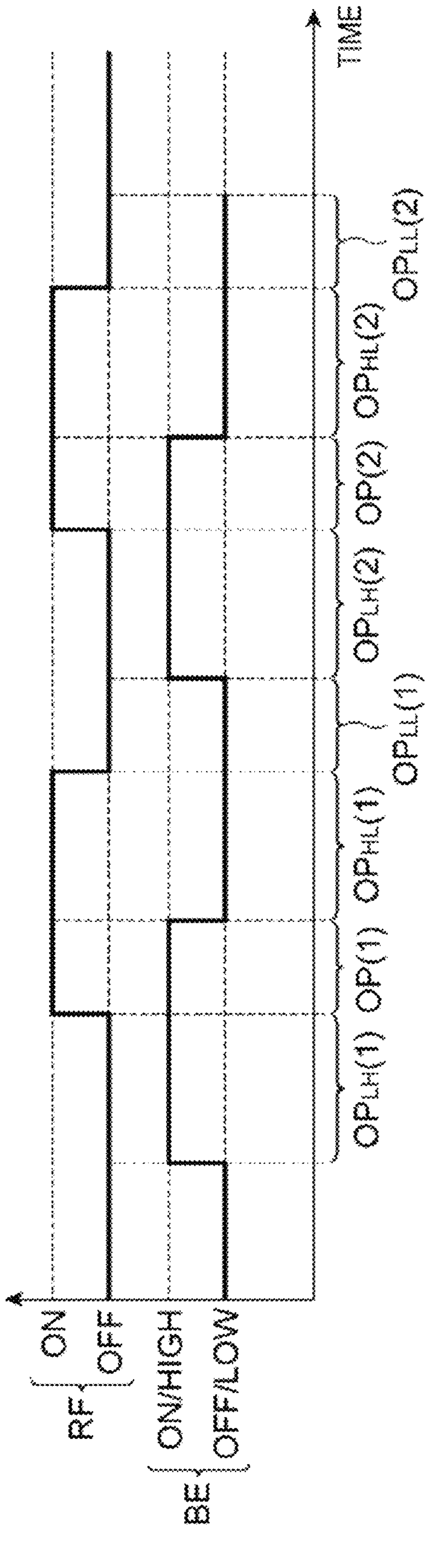
Figure 22:
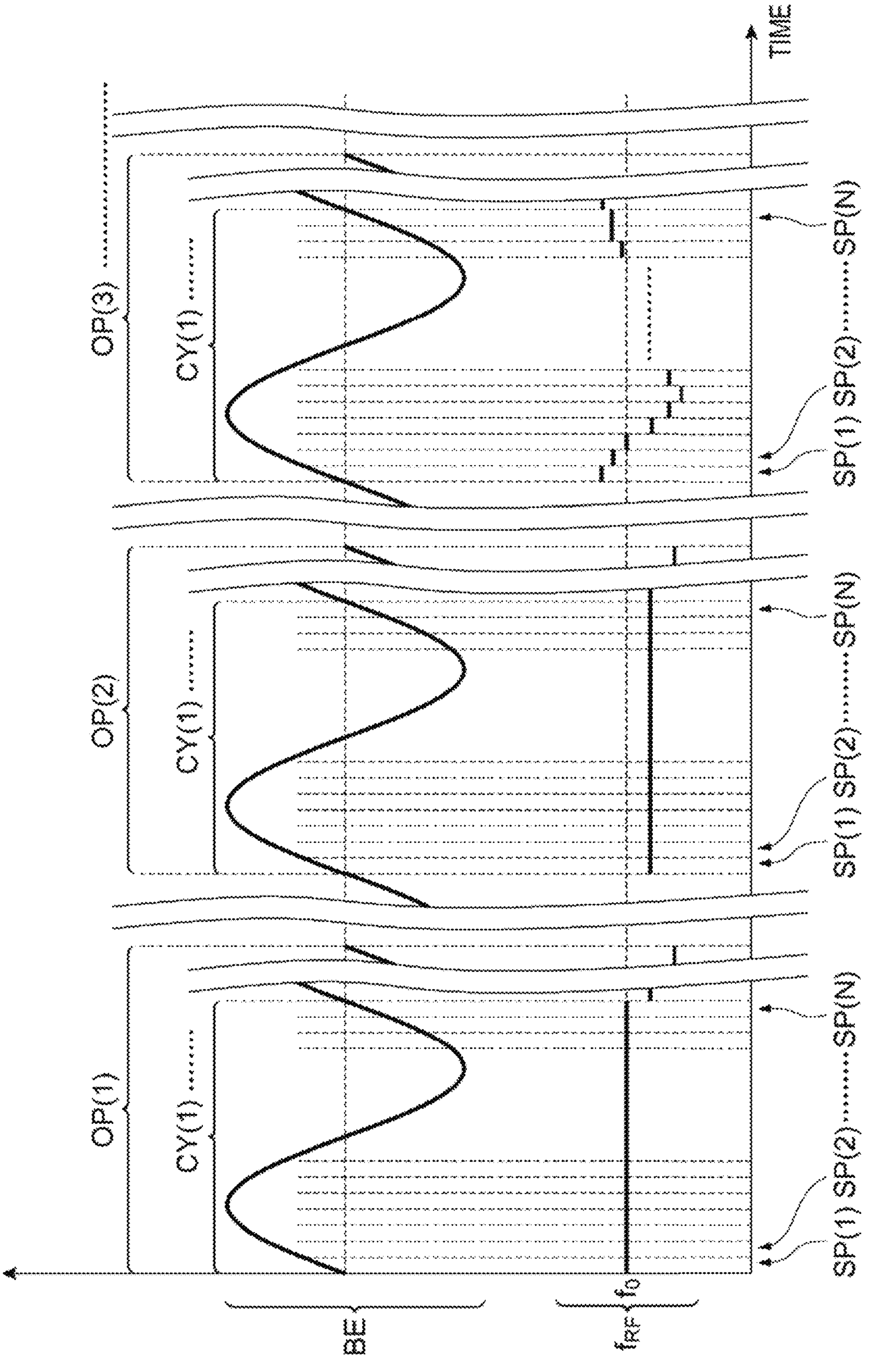
FIG. 22 is a timing chart related to a seventh example of the source frequency adjustment.

Alternatively, as illustrated in FIGS. 20B, 21A, and 21B, the source radio-frequency power RF may be supplied as the ON/OFF pulse or the HIGH/LOW pulse to the radio-frequency electrode. The radio-frequency power supply 31 supplies the source radio-frequency power RF in the ON or HIGH state, in the period during which a second control signal given from the main control unit 2 has the first state (e.g., the ON state). Further, when the state of the second control signal enters the first state in the period during which the electric bias energy BE is being supplied, the radio-frequency power supply 31 may start the supply of the source radio-frequency power RF in the ON or HIGH state at the timing synchronized with the initial cycle CY of the electric bias energy BE after the state of the second control signal enters the first state. Further, the radio-frequency power supply 31 sets the source radio-frequency power RF to the OFF or LOW state, in the period during which the second control signal has the second state (e.g., the OFF state).

As illustrated in FIG. 20B, the period during which the pulse of the electric bias energy BE is supplied and the period during which the pulse of the source radio-frequency power RF is supplied may be identical to each other. In this case, the plurality of overlap periods OP coincide with the period during which the pulse of the electric bias energy BE is supplied, and also coincide with the period during which the pulse of the source radio-frequency power RF is supplied.

As illustrated in FIGS. 21A and 21B, each of the plurality of periods during which the pulse of the source radio-frequency power RF is supplied may partially overlap with one of the plurality of periods during which the pulse of the electric bias energy BE is supplied. That is, each of the plurality of overlap periods OP is a partial period during which the pulse of the source radio-frequency power RF is supplied simultaneously within the period during which the pulse of the electric bias energy BE is supplied.

As illustrated in FIG. 21A, in a case where the source radio-frequency power RF is being supplied at the time when the supply of the pulse of the electric bias energy BE is started, the level of the electric bias energy BE may be set to a low level during a time until the timing specified by the first clock signal for the first time after the state of the first control signal becomes the first state. As illustrated in FIG. 21A, the level of the electric bias energy BE may be set to a low level immediately after the overlap periods OP.

In the descriptions hereinafter, an overlap period OP(k) represents a k-th overlap period among the plurality of overlap periods OP. That is, the overlap period OP(k) represents any overlap period among the plurality of overlap periods OP. The plurality of overlap periods OP include a plurality of (an M number of) cycles CY. Each cycle CY includes a plurality of (an N number of) phase periods SP. A cycle CY(m) represents an m-th cycle among the plurality of cycles CY in each of the plurality of overlap periods OP. A cycle CY(k,m) represents the m-th cycle in the k-th overlap period.

In the seventh example of the adjustment of the source frequency $f_{RF}$, the control unit 35 adjusts the source frequency $f_{RF}$ of the source radio-frequency power RF in each of the plurality of phase periods SP of each of the plurality of cycles CY included in each of the plurality of overlap periods OP.

Hereinafter, first, the setting of the frequency of the source radio-frequency power RF in a first overlap period OP, i.e., the overlap period OP(1), will be described. The control unit 35 adjusts the source frequency $f_{RF}$ of the source radio-frequency power RF in a phase period SP(1,m,n) of a cycle CY(1,m) within the overlap period OP(1) according to the change of the representative value RV(n). A phase period SP(k,m,n) represents an n-th phase period SP of the cycle CY(k,m) within the k-th overlap period OP(k). The adjustment of the frequency of the source radio-frequency power RF in the phase period SP(1,m,n) is performed in the same manner as the adjustment of the source frequency $f_{RF}$ of the source radio-frequency power RF of the phase period SP(m, n) in the second example.

Hereinafter, the setting of the source frequency $f_{RF}$ of the source radio-frequency power RF in the second to (T−1)-th overlap periods OP(k) will be described. Here, "T" is an integer equal to or larger than 3 and less than K. The source frequency $f_{RF}$ of the source radio-frequency power RF of the plurality of phase periods SP in the plurality of cycles CY within the overlap period OP(k) may be set using the same setting process described above for the source frequency $f_{RF}$ of the source radio-frequency power RF of the plurality of phase periods SP in the plurality of cycles CY within the overlap period OP(1). In the setting of the source frequency $f_{RF}$ of the source radio-frequency power RF of the plurality of phase periods SP in the period CY(1) within the overlap period OP(k), the cycle CY(M−1) and the cycle CY(M) within the overlap period OP(k−1) may be used as a first cycle and a second cycle. Further, in the setting of the frequency of the source radio-frequency power RF of the plurality of phase periods SP in the cycle CY(2) within the overlap period OP(k), the cycle CY(M) within the overlap period OP(k−1) and the cycle CY(1) within the overlap period OP(k) may be used as a first cycle and a second cycle.

Alternatively, the source frequency $f_{RF}$ of the source radio-frequency power RF of the plurality of phase periods SP in the plurality of cycles CY within the overlap period OP(k) may be set using each frequency registered in a table prepared in advance.

Hereinafter, the setting of the source frequency $f_{RF}$ of the source radio-frequency power RF in the T-th to K-th overlap periods OP(k) will be described with reference to FIG. 22. The control unit 35 adjusts the source frequency $f_{RF}$ of the source radio-frequency power RF in the phase period SP(n) of the cycle CY(m) within the overlap period OP(k), i.e., the phase period SP(k,m,n), according to the change of the representative value RV(n). The change of the representative value RV(n) is identified by using the source frequencies $f_{RF}$ of the different source radio-frequency powers RF in the corresponding phase periods SP(n) of the cycles CY(m) within two or more overlap periods OP preceding the overlap period OP(k).

The two or more overlap periods OP preceding the overlap period OP(k) include a first overlap period and a second overlap period. The first overlap period is the overlap period OP(k−Q(2)), and the second overlap period is the overlap period OP(k−Q(1)) subsequent to the first overlap period. Here, Q(1) is an integer equal to or larger than 1, Q(2) is an integer equal to or larger than 2, and $Q(1)<Q(2)$ is satisfied.

The control unit 35 gives one frequency shift from the frequency of the source radio-frequency power in the phase period SP(k−Q(2),m,n), to the frequency f(k−Q(1),m,n) of the source radio-frequency power in the phase period SP (k−Q(1),m,n). Here, f(k,m,n) represents the frequency of the source radio-frequency power RF used in the phase period SP(k,m,n). f(k,m,n) is expressed as $f(k,m,n)=f(k-Q(1),m,n)+\Delta(k,m,n)$. Δ(k,m,n) represents the amount of the frequency shift. The one frequency shift is either one of a frequency decrease and a frequency increase. When the one frequency shift is the frequency decrease, Δ(k,m,n) has a negative value. When the one frequency shift is the frequency increase, Δ(k,m,n) has a positive value.

The control unit 35 identifies the increase or decrease in the degree of reflection of the source radio-frequency power RF (e.g., the power level Pr of the reflected wave) due to the frequency shift, from the change between the representative value RV(k-Q(2),m,n) and the representative value RV(k−Q(1),m,n). When the degree of reflection of the source radio-frequency power RF decreases due to the one frequency shift, the control unit 35 sets the frequency f(k,m,n) to a frequency having the one frequency shift relative to the frequency f(k−Q(1),m,n). At this time, the RV(k,m,n) represents the representative value RV in the phase period SP(k,m,n).

The frequency of the source radio-frequency power RF in the phase period SP(m,n) of each of the two or more overlap periods preceding the overlap period OP(k) may be updated to have the one frequency shift relative to the frequency of the source radio-frequency power RF in the phase period SP(m,n) of the overlap period preceding the two or more overlap periods. In this case, when the degree of reflection of the source radio-frequency power RF in the phase period SP(m,n) of each of the two or more overlap periods tends to increase, the other frequency shift may be given to the frequency of the source radio-frequency power RF in the phase period SP(m,n) of the overlap period OP(k). For example, the frequency of the source radio-frequency power RF of the phase period SP(m,n) of the overlap period OP(k) may be set to the frequency having the other frequency shift relative to the frequency of the source radio-frequency power RF of the earliest overlap period of the two or more overlap periods.

The amount of one frequency shift Δ(m,n) in the phase period SP(k,m,n) may be the same as the amount of one frequency shift Δ(k−Q(1),m,n) in the phase period SP(k−Q (1),m,n). That is, the absolute value of the amount of frequency shift Δ(k,m,n) may be the same as the amount of frequency shift Δ(k−Q(1),m,n). Further, the absolute value of the amount of frequency shift Δ(k,m,n) may be larger than the amount of frequency shift Δ(k−Q(1),m,n). Further, the absolute value of the amount of frequency shift Δ(k,m,n) may be set to increase as the degree of reflection in the phase period SP(k−Q(1),m,n) increases. For example, the absolute value of the amount of frequency shift Δ(k,m,n) may be determined by a function of the degree of reflection.

There may be a case where the degree of reflection of the source radio-frequency power RF in the phase period SP(k−Q(1),m,n) increases from the degree of reflection of the source radio-frequency power RF in the phase period SP(k−Q(2),m,n) due to the one frequency shift. In this case, the control unit 35 may set the frequency f(k,m,n) to a frequency having the other frequency shift relative to the frequency f(k−Q(1),m,n).

There may be a case where the degree of reflection of the source radio-frequency power RF in the phase period SP(k, m,n) increases from the degree of reflection of the source radio-frequency power RF in the phase period SP(k−Q(1), m,n) due to the one frequency shift. In this case, the control unit 35 may set the frequency of the source radio-frequency power RF in the phase period SP(k+Q(1),m,n) to an intermediate frequency. That is, in this case, the frequency of the source radio-frequency power RF in the phase period SP(n) of the cycle CY(m) within the overlap period OP(k+Q(1)) may be set to the intermediate frequency. The overlap period OP(k+Q(1)) is a third overlap period after the overlap period OP(k). The intermediate frequency that may be set in the phase period SP(k+Q(1),m,n) is the frequency between f(k−Q(1),m,n) and f(k,m,n), and may be an average value of f(k−Q(1),m,n) and f(k,m,n).

Further, there may be a case where the degree of reflection of the source radio-frequency power RF becomes larger than a predetermined threshold value when the intermediate frequency is used in the phase period SP(k+Q(1),m,n). In this case, the control unit 35 may set the frequency of the source radio-frequency power RF in the phase period SP(k+Q(2),m,n) to a frequency having the other frequency shift relative to the intermediate frequency. That is, in this case, the other frequency shift may be given to the frequency of the source radio-frequency power RF in the phase period SP(n) of the cycle CY(m) within the overlap period OP(k+Q(2)). The overlap period OP(k+Q(2)) is a fourth overlap period after the overlap period OP(k+Q(1)). The threshold value is predetermined. The absolute value of the amount of the other frequency shift Δ(k+Q(2),m,n) is larger than the absolute value of the one frequency shift Δ(k,m,n). In this case, it is possible to avoid that the amount of reflection of the source radio-frequency power RF cannot be reduced from a local minimum value. Further, the threshold values for the plurality of respective phase periods SP in each of the plurality of cycles CY within the plurality of overlap periods OP may be the same or different from each other.

Further, the source frequency $f_{RF}$ of the source radio-frequency power RF supplied in periods other than the plurality of overlap periods OP may be fixed. Alternatively, the source frequency $f_{RF}$ of the source radio-frequency power RF may also be adjusted in a plurality of overlap periods $OP_{HL}$, as in the plurality of overlap periods OP. The plurality of overlap periods $OP_{HL}$ are periods during which the source radio-frequency power RF in the HIGH or ON state and the electric bias energy BE in the LOW state are supplied simultaneously. Further, the source frequency $f_{RF}$ of the source radio-frequency power RF may also be adjusted in a plurality of overlap periods $OP_{LL}$, as in the plurality of overlap periods OP. The plurality of overlap periods $OP_{LL}$ are periods during which the source radio-frequency power RF in the LOW state and the electric bias energy BE in the LOW state are supplied simultaneously. Further, the source frequency $f_{RF}$ of the source radio-frequency power RF may also be adjusted in a plurality of overlap periods $OP_{LH}$, as in the plurality of overlap periods OP. The plurality of overlap periods $OP_{LH}$ are periods during which the source radio-frequency power RF in the LOW state and the electric bias energy BE in the HIGH state are supplied simultaneously.

Eighth Example of Adjustment of Source Frequency $f_{RF}$

In an eighth example, the source frequency $f_{RF}$ of the source radio-frequency power RF for each of the plurality of phase periods SP in each cycle CY is determined in advance. Specifically, for each of the phase periods SP in the cycle CY, a frequency determined by adding each of a plurality of frequency offsets to a reference frequency is used as the source frequency $f_{RF}$ of the source radio-frequency power RE. Each of the plurality of frequency offsets has a positive or negative value. Then, a frequency offset is determined for each phase period SP that maximizes the power level of the source radio-frequency power RF supplied to plasma. The power level of the source radio-frequency power RF supplied to plasma may be a difference between the power level of the traveling wave of the source radio-frequency power RF and the power level of the reflected wave. The frequency offset determined for each of the plurality of phase periods SP is stored in a table. The control unit 35 uses the frequency determined by adding a corresponding frequency offset stored in the table to the reference frequency, as the source frequency $f_{RF}$ of the source radio-frequency power RF in each phase period SP within each cycle CY.

While various embodiments have been described, the present disclosure is not limited to the embodiments, and various additions, omissions, substitutions, and modifications may be made thereto. Further, elements in different embodiments may be combined with each other to form another embodiment.

In another embodiment, the plasma processing apparatus may be an inductively coupled plasma processing apparatus, an ECR plasma processing apparatus, a helicon wave excited plasma processing apparatus, or a surface wave plasma processing apparatus. In any plasma processing apparatus, the source radio-frequency power is used to generate plasma.

The various embodiments included in the present disclosure are described in [E1] to [E16] below.

[E1]

A plasma processing apparatus including:

a chamber;

a substrate support provided in the chamber;

a bias power supply that is electrically connected to the substrate support, and generates an electric bias energy having a bias frequency at a timing specified by a first clock signal; and a radio-frequency power supply that generates a source radio-frequency power having a source frequency, in order to generate a plasma from a gas in the chamber, wherein the radio-frequency power supply outputs the source radio-frequency power having the source frequency adjusted at a timing specified by a second clock signal, when the electric bias energy is being supplied to the substrate support, and the second clock signal has a frequency higher than the bias frequency, and is synchronized with the first clock signal.

In the embodiment of E1, the source frequency of the source radio-frequency power is adjusted in a plurality of phases within the cycle of the electrical bias energy. The timing for adjusting the source frequency of the source radio-frequency power is specified by a second clock signal. The second clock signal is synchronized with a first clock signal that specifies the timing for generating the electric bias energy. Thus, according to the embodiment of E1, it is possible to precisely synchronize the phases in the cycle of the electric bias energy and the timing for adjusting the source frequency of the source radio-frequency power.

[E2]

The plasma processing apparatus described in E1 further including:

a reference clock signal generator that generates a reference clock signal; and a frequency divider that divides a frequency of the reference clock signal, thereby generating the second clock signal, wherein the first clock signal is the reference clock signal, or is generated by dividing a frequency of the reference clock signal in a separate frequency divider.

[E3]

The plasma processing apparatus described in E2, wherein the frequency divider generating the second clock signal, and/or the separate frequency divider includes a PLL circuit as a frequency multiplier, and a frequency demultiplier connected between a reference input of the PLL circuit and an output of the reference clock signal generator.

[E4]

The plasma processing apparatus described in E2 or E3, further including:

a sensor that outputs an electric signal reflecting a degree of reflection of the source radio-frequency power from a load, and an analog-to-digital converter connected to an output of the sensor, wherein the analog-to-digital converter performs an analog-to-digital conversion on the electric signal, at a timing specified by a third clock signal, to generate a digital signal, and the third clock signal is the reference clock signal, or is generated by dividing a frequency of the reference clock signal in a separate frequency divider.

[E5]

The plasma processing apparatus described in E4, wherein the frequency divider generating the third clock signal includes a PLL circuit as a frequency multiplier, and a frequency demultiplier connected between an output of the reference clock signal generator and a reference input of the PLL circuit.

[E6]

The plasma processing apparatus described in E4 or E5, further including:

a controller that generates a representative value from the digital signal in each of a plurality of phase periods synchronized with the second clock signal, and sets the source frequency of the source radio-frequency power in order to suppress the reflection of the source radio-frequency power based on the representative value in each of the plurality of phase periods.

[E7]

The plasma processing apparatus described in any one of E2 to E6, wherein the radio-frequency power supply includes a digital-to-analog converter that performs a digital-to-analog conversion of waveform data of the radio-frequency power at a timing specified by a fourth clock signal synchronized with the first clock signal, and an amplifier that is connected to an output of the digital-to-analog converter, and outputs the source radio-frequency power, wherein the fourth clock signal is the reference clock signal, or is generated by dividing a frequency of the reference clock signal in a separate frequency divider.

[E8]

The plasma processing apparatus described in E7, wherein the frequency divider generating the fourth clock signal includes a PLL circuit as a frequency multiplier, and a frequency demultiplier connected between an output of the reference clock signal generator and a reference input of the PLL circuit.

[E9]

The plasma processing apparatus described in any one of [E2] to [E8], wherein the electric bias energy is the bias radio-frequency power having the bias frequency or a voltage generated periodically at a time interval, which is a reciprocal of the bias frequency, the bias power supply includes a digital-to-analog converter that performs a digital-to-analog conversion of waveform data of the electric bias energy at the timing specified by the first clock signal, and an amplifier that is connected to an output of the digital-to-analog converter of the bias power supply, and outputs the electric bias energy.

[E10]

The plasma processing apparatus described in any one of [E2] to [E8], wherein the electric bias energy is a pulse of a voltage generated periodically at a time interval, which is a reciprocal of the bias frequency, and the bias power supply includes a DC power supply, and a pulse unit that connects the DC power supply to an output of the bias power supply at a timing of one of a vertical rise and a vertical fall of the first clock signal, and connects the output of the bias power supply to a ground at a timing of a remaining of the vertical rise and the vertical fall.

[E11]

A control method including:

(a) supplying an electric bias energy having a bias frequency from a bias power supply to a substrate support provided in a chamber of a plasma processing apparatus; and (b) supplying a source radio-frequency power having a source frequency from a radio-frequency power supply in order to generate a plasma from a gas in the chamber, wherein in (a), the electric bias energy is generated at a timing specified by a first clock signal, in (b), the radio-frequency power supply outputs the source radio-frequency power having the source frequency adjusted at a timing specified by a second clock signal, when the electric bias energy is being supplied to the substrate support, and the second clock signal has a frequency higher than the bias frequency, and is synchronized with the first clock signal.

[E12]

The control method described in E11, wherein the second clock signal is generated by dividing a frequency of a reference clock signal generated by a reference clock signal generator in a frequency divider, and the first clock signal is the reference clock signal, or is generated by dividing a frequency of the reference clock signal in a separate frequency divider.

[E13]

A power supply system including:

a bias power supply that generates an electric bias energy to be supplied to a substrate support in a chamber of a plasma processing apparatus, at a timing specified by a first clock signal, and a radio-frequency power supply that generates a source radio-frequency power for generating a plasma from a gas in the chamber, wherein the radio-frequency power supply outputs the source radio-frequency power having a source frequency adjusted at a timing specified by a second clock signal, when the electric bias energy is being supplied to the substrate support, and the second clock signal has a frequency higher than a bias frequency of the electric bias energy, and is synchronized to the first clock signal.

[E14]

The power supply system described in E13, further including:

a reference clock signal generator that generates a reference clock signal; and a frequency divider divides a frequency of the reference clock signal, thereby generating the second clock signal, and wherein the first clock signal is the reference clock signal, or is generated by dividing a frequency of the reference clock signal in a separate frequency divider.

[E15]

A program to be executed by a computer of a plasma processing apparatus to cause the plasma processing apparatus to perform the control method described in E11.

[E16]

A storage medium storing the program described in E15.

According to an embodiment, it is possible to precisely synchronize the timing for adjusting a phase within a cycle of an electric bias energy and a frequency of a source radio-frequency power.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:

a chamber;

a substrate support provided in the chamber;

a bias power supply electrically connected to the substrate support, and configured to generate an electric bias energy having a bias frequency at a timing specified by a first clock signal; and a radio-frequency power supply configured to generate a source radio-frequency power having a source frequency, in order to generate a plasma from a gas in the chamber, wherein the radio-frequency power supply is configured to output the source radio-frequency power having the source frequency adjusted at a timing specified by a second clock signal, when the electric bias energy is being supplied to the substrate support, and the second clock signal has a frequency higher than the bias frequency, and is synchronized with the first clock signal.

2. The plasma processing apparatus according to claim 1, further comprising:

a reference clock signal generator configured to generate a reference clock signal; and a frequency divider configured to divide a frequency of the reference clock signal, thereby generating the second clock signal, wherein the first clock signal is the reference clock signal, or is generated by dividing a frequency of the reference clock signal in a separate frequency divider.

3. The plasma processing apparatus according to claim 2, wherein the frequency divider generating the second clock signal and the separate frequency divider include a PLL circuit as a frequency multiplier, and a frequency demultiplier connected between a reference input of the PLL circuit and an output of the reference clock signal generator.

4. The plasma processing apparatus according to claim 2, further comprising:

a sensor configured to output an electric signal reflecting a degree of reflection of the source radio-frequency power from a load, and an analog-to-digital converter connected to an output of the sensor, wherein the analog-to-digital converter is configured to perform an analog-to-digital conversion on the electric signal, at a timing specified by a third clock signal, to generate a digital signal, and the third clock signal is the reference clock signal, or is generated by dividing a frequency of the reference clock signal in a separate frequency divider.

5. The plasma processing apparatus according to claim 4, wherein the frequency divider generating the third clock signal includes a PLL circuit as a frequency multiplier, and a frequency demultiplier connected between an output of the reference clock signal generator and a reference input of the PLL circuit.

6. The plasma processing apparatus according to claim 4, further comprising:

a controller configured to generate a representative value from the digital signal in each of a plurality of phase periods synchronized with the second clock signal, and set the source frequency of the source radio-frequency power in order to suppress the reflection of the source radio-frequency power based on the representative value in each of the plurality of phase periods.

7. The plasma processing apparatus according to claim 2, wherein the radio-frequency power supply includes a digital-to-analog converter configured to perform a digital-to-analog conversion of waveform data of the radio-frequency power at a timing specified by a fourth clock signal synchronized with the first clock signal, and an amplifier connected to an output of the digital-to-analog converter, and configured to output the source radio-frequency power, wherein the fourth clock signal is the reference clock signal, or is generated by dividing a frequency of the reference clock signal in a separate frequency divider.

8. The plasma processing apparatus according to claim 7, wherein the frequency divider generating the fourth clock signal includes a PLL circuit as a frequency multiplier, and a frequency demultiplier connected between an output of the reference clock signal generator and a reference input of the PLL circuit.

9. The plasma processing apparatus according to claim 2, wherein the electric bias energy is the bias radio-frequency power having the bias frequency or a voltage generated periodically at a time interval, which is a reciprocal of the bias frequency, the bias power supply includes a digital-to-analog converter configured to perform a digital-to-analog conversion of waveform data of the electric bias energy at the timing specified by the first clock signal, and an amplifier connected to an output of the digital-to-analog converter of the bias power supply, and configured to output the electric bias energy.

10. The plasma processing apparatus according to claim 2, wherein the electric bias energy is a pulse of a voltage generated periodically at a time interval, which is a reciprocal of the bias frequency, and the bias power supply includes a DC power supply, and a pulse unit configured to connect the DC power supply to an output of the bias power supply at a timing of one of a vertical rise and a vertical fall of the first clock signal, and connect the output of the bias power supply to a ground at a timing of a remaining of the vertical rise and the vertical fall.

11. A control method comprising:

(a) supplying an electric bias energy having a bias frequency from a bias power supply to a substrate support provided in a chamber of a plasma processing apparatus; and (b) supplying a source radio-frequency power having a source frequency from a radio-frequency power supply in order to generate a plasma from a gas in the chamber, wherein in (a), the electric bias energy is generated at a timing specified by a first clock signal, in (b), the radio-frequency power supply outputs the source radio-frequency power having the source frequency adjusted at a timing specified by a second clock signal, when the electric bias energy is being supplied to the substrate support, and the second clock signal has a frequency higher than the bias frequency, and is synchronized with the first clock signal.

12. The control method according to claim 11, wherein the second clock signal is generated by dividing a frequency of a reference clock signal generated by a reference clock signal generator in a frequency divider, and the first clock signal is the reference clock signal, or is generated by dividing a frequency of the reference clock signal in a separate frequency divider.

13. A power supply system comprising:

a bias power supply configured to generate an electric bias energy to be supplied to a substrate support in a chamber of a plasma processing apparatus, at a timing specified by a first clock signal, and a radio-frequency power supply configured to generate a source radio-frequency power for generating a plasma from a gas in the chamber, wherein the radio-frequency power supply is configured to output the source radio-frequency power having a source frequency adjusted at a timing specified by a second clock signal, when the electric bias energy is being supplied to the substrate support, and the second clock signal has a frequency higher than a bias frequency of the electric bias energy, and is synchronized to the first clock signal.

14. The power supply system according to claim 13, further comprising:

a reference clock signal generator configured to generate a reference clock signal; and a frequency divider configured to divide a frequency of the reference clock signal, thereby generating the second clock signal, and wherein the first clock signal is the reference clock signal, or is generated by dividing a frequency of the reference clock signal in a separate frequency divider.

15. A non-transitory computer-readable storage medium having stored therein a program that causes a plasma processing apparatus to perform a control method including:

(a) supplying an electric bias energy having a bias frequency from a bias power supply to a substrate support provided in a chamber of a plasma processing apparatus; and (b) supplying a source radio-frequency power having a source frequency from a radio-frequency power supply in order to generate a plasma from a gas in the chamber, wherein in (a), the electric bias energy is generated at a timing specified by a first clock signal, in (b), the radio-frequency power supply outputs the source radio-frequency power having the source frequency adjusted at a timing specified by a second clock signal, when the electric bias energy is being supplied to the substrate support, and the second clock signal has a frequency higher than the bias frequency, and is synchronized with the first clock signal.

* * * * *